(12) United States Patent
Wang et al.

(10) Patent No.: US 12,223,912 B2
(45) Date of Patent: Feb. 11, 2025

(54) DISPLAY SUBSTRATE AND DISPLAY APPARATUS FOR REDUCING LOAD OF CLOCK SIGNAL LINE

(71) Applicants: Chengdu BOE Optoelectronics Technology Co., Ltd., Chengdu (CN); BOE TECHNOLOGY GROUP CO., LTD., Beijing (CN)

(72) Inventors: Binyan Wang, Beijing (CN); Cong Liu, Beijing (CN); Tianyi Cheng, Beijing (CN); Feng Wei, Beijing (CN); Meng Li, Beijing (CN); Shiqian Dai, Beijing (CN); Kaipeng Sun, Beijing (CN); Lina Wang, Beijing (CN)

(73) Assignees: Chengdu BOE Optoelectronics Technology Co., Ltd., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/781,870

(22) PCT Filed: Jul. 23, 2021

(86) PCT No.: PCT/CN2021/108213
§ 371 (c)(1),
(2) Date: Jun. 2, 2022

(87) PCT Pub. No.: WO2023/000322
PCT Pub. Date: Jan. 26, 2023

(65) Prior Publication Data
US 2024/0078977 A1    Mar. 7, 2024

(51) Int. Cl.
*G09G 3/3266* (2016.01)
*G02F 1/133* (2006.01)
(Continued)

(52) U.S. Cl.
CPC .......... *G09G 3/3266* (2013.01); *G02F 1/133* (2013.01); *G09G 3/32* (2013.01); *G09G 3/36* (2013.01);
(Continued)

(58) Field of Classification Search
CPC .......... G09G 3/3266; G09G 3/32; G09G 3/36; G09G 2300/0426; G09G 2310/0267;
(Continued)

(56) References Cited

U.S. PATENT DOCUMENTS 11,854,458 B2 * 12/2023 Huang ................. G09G 3/2092
2017/0004760 A1 * 1/2017 Jang ..................... G09G 3/3677
(Continued)

FOREIGN PATENT DOCUMENTS

| CN | 110767665 A | 2/2020 |
| CN | 111540313 A | 8/2020 |

(Continued)

OTHER PUBLICATIONS

International Search Report in PCT/CN2021/108213 dated Apr. 26, 2022 in Chinese.
(Continued)

*Primary Examiner* — Adam J Snyder
(74) *Attorney, Agent, or Firm* — Collard & Roe, P.C.; William Collard

(57) ABSTRACT

A display substrate and a display apparatus are disclosed. The display substrate includes a base substrate including a display region and a peripheral region located on at least one side of the display region, and a first gate drive circuit, the first gate drive circuit includes a first clock signal line, a second clock signal line and N shift register units that are cascaded; each shift register unit of the N shift register units includes a first output circuit; the first output circuit includes the first output transistor, the orthographic projection of the
(Continued)

second clock signal line on the base substrate is located between an orthographic projection of the first output transistor on the base substrate and the orthographic projection of the first clock signal line on the base substrate. The display substrate can reduce load of the first clock signal line and the second clock signal line.

20 Claims, 12 Drawing Sheets

(51) Int. Cl.
*G09G 3/32* (2016.01)
*G09G 3/36* (2006.01)
*H01L 27/12* (2006.01)

(52) U.S. Cl.
CPC ............... *G09G 2300/0408* (2013.01); *G09G 2300/0426* (2013.01); *G09G 2310/0267* (2013.01); *G09G 2310/0286* (2013.01); *G09G 2310/08* (2013.01); *H01L 27/12* (2013.01)

(58) Field of Classification Search
CPC ....... G09G 2310/0286; G09G 2310/08; G09G 2300/0408; G02F 1/133; H01L 27/12
See application file for complete search history.

(56) References Cited

U.S. PATENT DOCUMENTS

| | | | |
|---|---|---|---|
| 2017/0110050 A1* | 4/2017 | Park | G09G 3/3266 |
| 2019/0304374 A1* | 10/2019 | Wang | G09G 3/3266 |
| 2020/0168160 A1* | 5/2020 | Oh | G09G 3/3266 |
| 2021/0327361 A1* | 10/2021 | Park | G09G 3/3266 |
| 2022/0068212 A1 | 3/2022 | Yao et al. | |
| 2022/0302240 A1 | 9/2022 | Zhang et al. | |
| 2022/0310184 A1 | 9/2022 | Zhang et al. | |

FOREIGN PATENT DOCUMENTS

| | | |
|---|---|---|
| CN | 111816691 A | 10/2020 |
| CN | 112652271 A | 4/2021 |
| CN | 112687229 A | 4/2021 |
| CN | 112771601 A | 5/2021 |
| CN | 112838109 A | 5/2021 |
| EP | 3 961 611 A1 | 3/2022 |
| JP | 2010081110 A | 4/2010 |

OTHER PUBLICATIONS

Written Opinion in PCT/CN2021/108213 dated Apr. 26, 2022 in Chinese.

* cited by examiner

340

DISPLAY SUBSTRATE AND DISPLAY APPARATUS FOR REDUCING LOAD OF CLOCK SIGNAL LINE

CROSS REFERENCE TO RELATED APPLICATIONS

This application is the National Stage of PCT/CN2021/108213 filed on Jul. 23, 2021, the disclosure of which is incorporated by reference.

TECHNICAL FIELD

Embodiments of the present disclosure relate to a display substrate and a display apparatus.

BACKGROUND

In a field of display technology, for example, a pixel array of a liquid crystal display panel or an Organic Light Emitting Diode (OLED) display panel usually includes a plurality of rows of gate lines and a plurality of columns of data lines intersecting with the gate lines. The gate line may be driven by a bonded integrated driver circuit. In recent years, with continuous improvement of a fabrication process of amorphous silicon thin film transistors or oxide thin film transistors, a gate line driver circuit may also be directly integrated on a thin film transistor array substrate to form a Gate Driven on Array (GOA) to drive the gate line. For example, a GOA including a plurality of cascaded shift register units may be adopted to supply switching voltage signals (scan signals) to a plurality of rows of gate lines of the pixel array, so as to control the plurality of rows of gate lines to be turned on sequentially, and meanwhile, the data lines supply data signals to pixel units of corresponding rows in the pixel array, so as to form gray voltages required by respective gray scales of a displayed image in respective pixel units, and further display a frame of image.

SUMMARY

At least one embodiment of the present disclosure provides a display substrate, comprising: a base substrate, comprising a display region and a peripheral region located on at least one side of the display region; and a first gate drive circuit provided on the peripheral region of the base substrate, wherein the first gate drive circuit comprises a first clock signal line, a second clock signal line and N shift register units that are cascaded; each shift register unit of the N shift register units comprises a first control circuit, a second control circuit, a first output circuit, a second output circuit and an output terminal; the first output circuit is electrically connected with a first node, a first clock signal terminal and the output terminal, respectively, and is configured to turn on or turn off a connection between the output terminal and the first clock signal terminal under control of a potential of the first node; the second output circuit is electrically connected with a second node, the output terminal and a first voltage terminal, respectively, and is configured to turn on or turn off a connection between the output terminal and the first voltage terminal under control of a potential of the second node; the first control circuit is electrically connected with a control terminal, the first node and a first control voltage terminal, respectively, and is configured to turn on or turn off a connection between the first node and the first control voltage terminal under control of a control signal supplied by the control terminal; the second control circuit is electrically connected with the control terminal, the second node and a second control voltage terminal, respectively, and is configured to turn on or turn off a connection between the second node and the second control voltage terminal under control of the control signal; wherein the first clock signal line and the second clock signal line extend along a first direction on the base substrate, and are configured to supply a first clock signal to the first clock signal terminal of the shift register unit, and the first clock signal line and the second clock signal line are not connected with a same shift register unit; the first output circuit comprises a first output transistor, an orthographic projection of the first clock signal line and an orthographic projection of the second clock signal line on the base substrate are located on a side of the first output transistor close to the display region, the orthographic projection of the second clock signal line on the base substrate is located between an orthographic projection of the first output transistor on the base substrate and the orthographic projection of the first clock signal line on the base substrate; and where N is an integer greater than 1.

For example, the display substrate provided by at least one embodiment of the present disclosure further comprises a third clock signal line and a fourth clock signal line extending along the first direction, the shift register unit further comprises a second node control circuit and a third node control circuit, wherein the third node control circuit is electrically connected with the first clock signal terminal, the second clock signal terminal, the input terminal and a third node, respectively, and is configured to turn on or turn off a connection between the third node and the input terminal under control of a first clock signal supplied by the first clock signal terminal and a second clock signal supplied by the second clock signal terminal; the second node control circuit is electrically connected with the second node, a second voltage terminal, a fourth node, a third clock signal terminal and a control node, respectively, and is configured to turn on or turn off a connection between the control node and the second voltage terminal under control of a potential of the fourth node, and to turn on or turn off a connection between the control node and the third clock signal terminal under control of the potential of the second node, and to control the potential of the second node according to a potential of the control node; wherein the third clock signal line is connected with a second clock signal terminal of a (2n)th-stage shift register unit to supply the second clock signal, the fourth clock signal line is connected with a third clock signal terminal of the (2n)th-stage shift register unit to supply a third clock signal, the fourth clock signal line is connected with a second clock signal terminal of a (2n−1)th-stage shift register unit to supply the second clock signal; the third clock signal line is connected with a third clock signal terminal of the (2n−1)th-stage shift register unit to supply the third clock signal, and n is an integer greater than or equal to 1 and less than or equal to N; and an orthographic projection of the third clock signal line and an orthographic projection of the fourth clock signal line on the base substrate are located on a side of the first output transistor away from the display region.

For example, the display substrate provided by at least one embodiment of the present disclosure further comprises a second gate drive circuit and a third gate drive circuit, wherein the display region comprises a plurality of rows and a plurality of columns of pixel units; the first gate drive circuit is configured to be connected with gate electrodes of oxide transistors in the plurality of rows of pixel units; the second gate drive circuit is configured to be connected with gate electrodes of data writing transistors in the plurality of rows of pixel units; the third gate drive circuit is configured to be connected with gate electrodes of light-emitting control transistors in the plurality of rows of pixel units to control light emission of light-emitting elements in the plurality of rows of pixel units; and orthographic projections of the second gate drive circuit and the third gate drive circuit on the base substrate are located on a side of an orthographic projection of the first gate drive circuit on the base substrate away from the display region.

For example, in the display substrate provided by at least one embodiment of the present disclosure, the second output circuit comprises a second output transistor, an active layer of the first output transistor and an active layer of the second output transistor are located in a continuous first semiconductor layer, the first semiconductor layer extends along the first direction; a gate electrode of the first output transistor and a gate electrode of the second output transistor both extend along a second direction different from the first direction; and the gate electrode of the first output transistor comprises a plurality of sub-gate electrodes arranged in parallel in the first direction.

For example, in the display substrate provided by at least one embodiment of the present disclosure, the first control circuit comprises a first control transistor, and the second control circuit comprises a second control transistor, an active layer of the first control transistor and an active layer of the second control transistor are arranged side by side in the second direction, a gate electrode of the first control transistor and a gate electrode of the second control transistor are integrally formed and extend along the second direction, and an orthographic projection of the first output transistor on the base substrate is located between an orthographic projection of the first control transistor and the second control transistor on the base substrate and an orthographic projection of the second clock signal line on the base substrate, and an orthographic projection of the first control transistor on the base substrate is located between an orthographic projection of the second control transistor on the base substrate and the orthographic projection of the first output transistor on the base substrate.

For example, the display substrate provided by at least one embodiment of the present disclosure further comprises a reset signal line, a first connecting electrode and a first connecting line; wherein the reset signal line extends along the first direction and is configured to be connected with a control terminal of the first control circuit and a control terminal of the second control circuit to supply the control signal; the first connecting line extends along the second direction, a first terminal of the first connecting line is connected with the reset signal line through a via hole penetrating through an insulating layer, and a second terminal of the first connecting line is connected with a first terminal of the first connecting electrode through a via hole penetrating through an insulating layer; and the first connecting electrode extends along the first direction, a second terminal of the first connecting electrode is connected with the gate electrode of the first control transistor and the gate electrode of the second control transistor through a via hole penetrating through an insulating layer.

For example, the display substrate provided by at least one embodiment of the present disclosure further comprises a first control voltage line, wherein the first control voltage line extends along the first direction, and is configured to be connected with the first control voltage terminal to supply a first control voltage, and an orthographic projection of the first control voltage line on the base substrate is located on a side of an orthographic projection of the reset signal line on the base substrate close to the display region.

For example, the display substrate provided by at least one embodiment of the present disclosure further comprises a second connecting electrode and a second connecting line, wherein a first terminal of the second connecting electrode is connected and integrally formed with a first electrode of the first control transistor, a second terminal of the second connecting electrode is connected with a first terminal of the second connecting line through a via hole penetrating through an insulating layer, and a second terminal of the second connecting line is connected with the first control voltage line through a via hole penetrating through an insulating layer.

For example, the display substrate provided by at least one embodiment of the present disclosure further comprises a third connecting electrode, wherein a first terminal of the third connecting electrode is connected and integrally formed with a second electrode of the first control transistor; and a second terminal of the third connecting electrode is connected with the gate electrode of the first output transistor through a via hole penetrating through an insulating layer.

For example, the display substrate provided by at least one embodiment of the present disclosure further comprises a second control voltage line, wherein the second control voltage line extends along the first direction, and is configured to be connected with the second control voltage terminal to supply the second control voltage; and an orthographic projection of the first control voltage line on the base substrate is located between an orthographic projection of the second control voltage line on the base substrate and the orthographic projection of the reset signal line on the base substrate.

For example, the display substrate provided by at least one embodiment of the present disclosure further comprises a fourth connecting electrode and a third connecting line, wherein a first terminal of the fourth connecting electrode is connected and integrally formed with the first electrode of the second control transistor; a second terminal of the fourth connecting electrode is connected with a first terminal of the third connecting line through a via hole penetrating through an insulating layer; and a second terminal of the third connecting line is connected with the second control voltage line through a via hole penetrating through an insulating layer.

For example, in the display substrate provided by at least one embodiment of the present disclosure, the shift register unit further comprises a fourth node control circuit, a sixth node control circuit and a first node control circuit, wherein the fourth node control circuit is electrically connected with the first voltage terminal, the second clock signal terminal, the fourth node and the third node, respectively, and is configured to turn on or turn off a connection between the fourth node and the first voltage terminal under control of the second clock signal, and to turn on or turn off a connection between the fourth node and the second clock signal terminal under control of a potential of the third node; the sixth node control circuit is electrically connected with a fifth node, the third clock signal terminal and a sixth node, respectively, and is configured to turn on or turn off a connection between the sixth node and the third clock signal terminal under control of a potential of the fifth node, and control a potential of the sixth node according to the potential of the fifth node; and the first node control circuit is electrically connected with the sixth node, the third clock signal terminal, the first node, the second node and the first clock signal terminal, respectively, and is configured to turn on or turn off a connection between the sixth node and the first node under control of a third clock signal supplied by the third clock signal terminal, turn on or turn off a connection between the first node and the first clock signal terminal under control of the potential of the second node, and control the potential of the first node according to the first clock signal.

For example, in the display substrate provided by at least one embodiment of the present disclosure, the first node control circuit comprises a first transistor, a second transistor and a first capacitor; an active layer of the first transistor extends along the second direction, a gate electrode of the first transistor extends along the first direction, an active layer of the second transistor extends along the second direction, an orthographic projection of the first capacitor on the base substrate is located between an orthographic projection of the active layer of the first output transistor on the base substrate and the orthographic projection of the second clock signal line on the base substrate; and in the second direction, an orthographic projection of the second transistor on the base substrate is located between the orthographic projection of the first transistor on the base substrate and an orthographic projection of the second control transistor on the base substrate.

For example, the display substrate provided by at least one embodiment of the present disclosure further comprises a fifth connecting electrode, wherein the fifth connecting electrode comprises a first portion extending along the first direction and a second portion extending along the second direction; and a first terminal of the first portion of the fifth connecting electrode is connected with a gate electrode of the second transistor, a second terminal of the first portion of the fifth connecting electrode is connected with a first terminal of the second portion of the fifth connecting electrode, a second terminal of the second portion of the fifth connecting electrode is connected and integrally formed with the second electrode of the second control transistor; and the second terminal of the second portion of the fifth connecting electrode is also connected with the gate electrode of the second output transistor through a via hole penetrating through an insulating layer.

For example, the display substrate provided by at least one embodiment of the present disclosure further comprises a sixth connecting electrode, wherein the sixth connecting electrode has a "U" shape, a first terminal of the sixth connecting electrode is connected and integrally formed with a first electrode of the first transistor, and a second terminal of the sixth connecting electrode is connected and integrally formed with a first electrode of the second transistor.

For example, the display substrate provided by at least one embodiment of the present disclosure further comprises a seventh connecting electrode and a first intermediate transfer electrode, wherein a first portion of the seventh connecting electrode extends along the first direction, and is connected and integrally formed with a second electrode of the second transistor; a second portion of the seventh connecting electrode extends along the second direction, and is connected with the gate electrode of the first output transistor and a first electrode of the first capacitor through a via hole penetrating through an insulating layer, a third portion of the seventh connecting electrode is connected with the first terminal of the first intermediate transfer electrode through a via hole penetrating through an insulating layer, and a second terminal of the first intermediate transfer electrode serves as the first clock signal terminal and is connected with the first clock signal line or the second clock signal line through a via hole penetrating through an insulating layer.

For example, in the display substrate provided by at least one embodiment of the present disclosure, the second node control circuit comprises a third transistor, a fourth transistor and a second capacitor, wherein an active layer of the third transistor extends along the second direction, an active layer of the fourth transistor extends along the second direction; a gate electrode of the third transistor and a gate electrode of the second transistor are connected and integrally formed with a first electrode of the second capacitor; in the second direction, an orthographic projection of the fourth transistor on the base substrate is located between the orthographic projection of the first transistor on the base substrate and an orthographic projection of the third transistor on the base substrate.

For example, the display substrate provided by at least one embodiment of the present disclosure further comprises an eighth connecting electrode, wherein a first terminal of the eighth connecting electrode is connected and integrally formed with a first electrode of the third transistor, a second terminal of the eighth connecting electrode is connected and integrally formed with a first electrode of the fourth transistor, and a third terminal of the eighth connecting electrode is connected with a second electrode of the second capacitor through a via hole penetrating through an insulating layer.

For example, the display substrate provided by at least one embodiment of the present disclosure further comprises a second power line, wherein the second power line extends along the first direction, and is configured to be connected with the second voltage terminal to supply a second voltage signal, an orthographic projection of the second power line on the base substrate is located on a side of the orthographic projection of the first clock signal line on the base substrate close to the display region.

For example, the display substrate provided by at least one embodiment of the present disclosure further comprises a ninth connecting electrode and a fourth connecting line, wherein a first terminal of the ninth connecting electrode is connected with a first terminal of the fourth connecting line through a via hole penetrating through an insulating layer; a second terminal of the ninth connecting electrode is connected and integrally formed with a second electrode of the fourth transistor; and a second terminal of the fourth connecting line is connected with the second power line through a via hole penetrating through an insulating layer.

For example, the display substrate provided by at least one embodiment of the present disclosure further comprises a third clock signal line, wherein the third clock signal line is connected with a second clock signal terminal of a (2n)th-stage shift register unit to supply a second clock signal, and is connected with a third clock signal terminal of a (2n−1)th-stage shift register unit to supply a third clock signal, and n is an integer greater than or equal to 1 and less than or equal to N, wherein the third node control circuit comprises a fifth transistor and a sixth transistor, an active layer of the fifth transistor extends along the second direction, a gate electrode of the fifth transistor extends along the first direction and is connected with a first terminal of the seventh connecting electrode through a via hole penetrating through an insulating layer; an active layer of the sixth transistor extends along the first direction, a gate electrode of and the sixth transistor extends along the second direction, and a first terminal of a gate electrode of the sixth transistor is connected with the third clock signal line through a via hole penetrating through an insulating layer.

For example, the display substrate provided by at least one embodiment of the present disclosure further comprises a tenth connecting electrode, an eleventh connecting electrode, a twelfth connecting electrode, a fifth connecting line and a second intermediate transfer electrode; wherein a first terminal of the tenth connecting electrode is connected with a first terminal of the fifth connecting line through a via hole penetrating through an insulating layer, a second terminal of the tenth connecting electrode is connected and integrally formed with a second electrode of the sixth transistor; a first terminal of the eleventh connecting electrode is connected with a second terminal of the fifth connecting line through a via hole penetrating through an insulating layer, a second terminal of the eleventh connecting electrode is connected and integrally formed with a first electrode of the fifth transistor; and a first terminal of the twelfth connecting electrode is connected and integrally formed with a second electrode of the fifth transistor, a second terminal of the twelfth connecting electrode is connected with a first terminal of the second intermediate transfer electrode through a via hole penetrating through an insulating layer.

For example, in the display substrate provided by at least one embodiment of the present disclosure, the fourth node control circuit comprises a seventh transistor and an eighth transistor, a gate electrode of the seventh transistor and the gate electrode of the sixth transistor are integrally formed; an active layer of the seventh transistor and an active layer of the eighth transistor are located in a continuous second semiconductor layer; and the active layer of the eighth transistor has a "U" shape, and a gate electrode of the eighth transistor extends along the second direction.

For example, the display substrate provided by at least one embodiment of the present disclosure further comprises a thirteenth connecting electrode, a fourteenth connecting electrode and a fifteenth connecting electrode, a first terminal of the thirteenth connecting electrode is connected with the gate electrode of the sixth transistor through a via hole penetrating through an insulating layer, a second terminal of the thirteenth connecting electrode is connected and integrally formed with a first electrode of the eighth transistor; a first terminal of the fourteenth connecting electrode is connected and integrally formed with a first electrode of the seventh transistor, a second terminal of the fourteenth connecting electrode is connected and integrally formed with a second electrode of the eighth transistor; and a first terminal of the fifteenth connecting electrode is connected and integrally formed with a first electrode of the sixth transistor, and a second terminal of the fifteenth connecting electrode is connected with the gate electrode of the eighth transistor through a via hole penetrating through an insulating layer.

For example, the display substrate provided by at least one embodiment of the present disclosure further comprises a first power line, wherein the first power line extends along the first direction, and is configured to be connected with the first voltage terminal to supply a first voltage signal; and an orthographic projection of the first power line on the base substrate is located on a side of an orthographic projection of the third clock signal line on the base substrate close to the display region.

For example, the display substrate provided by at least one embodiment of the present disclosure further comprises a first transfer electrode and a sixteenth connecting electrode, wherein a first terminal of the first transfer electrode is connected with the first power line through a via hole penetrating through an insulating layer; a first terminal of the sixteenth connecting electrode is connected and integrally formed with a second electrode of the seventh transistor; and a second terminal of the sixteenth connecting electrode is connected with a second terminal of the first transfer electrode through a via hole penetrating through an insulating layer.

For example, the display substrate provided by at least one embodiment of the present disclosure further comprises a seventeenth connecting electrode and a sixth connecting line, wherein a first terminal of the seventeenth connecting electrode is connected with a gate electrode of the fourth transistor through a via hole penetrating through an insulating layer, a second terminal of the seventeenth connecting electrode is connected with a first terminal of the sixth connecting line through a via hole penetrating through an insulating layer; and a second terminal of the sixth connecting line is connected with the first terminal of the fourteenth connecting electrode through a via hole penetrating through an insulating layer.

For example, in the display substrate provided by at least one embodiment of the present disclosure, the sixth node control circuit comprises a ninth transistor and a third capacitor, the active layer of the first transistor and an active layer of the ninth transistor are located in a continuous third semiconductor layer; and the active layer of the ninth transistor extends along the first direction, and a gate electrode of the ninth transistor extends along the second direction.

For example, the display substrate provided by at least one embodiment of the present disclosure further comprises a fourth clock signal line, an eighteenth connecting electrode and a second transfer electrode, wherein the fourth clock signal line is connected with a third clock signal terminal of a (2n)th-stage shift register unit to supply a third clock signal and is connected with a second clock signal terminal of a (2n−1)th-stage shift register unit to supply the second clock signal; the second transfer electrode extends along the second direction; the eighteenth connecting electrode comprises a first portion extending along the second direction, a second portion extending along the second direction and a third portion extending along the first direction; the first portion, the second portion and the third portion of the eighteenth connecting electrode are integrally formed; a first terminal of the first portion of the eighteenth connecting electrode is connected with the gate electrode of the first transistor through a via hole penetrating through an insulating layer, a second terminal of the first portion of the eighteenth connecting electrode is connected and integrally formed with a first electrode of the ninth transistor, a third terminal of the first portion of the eighteenth connecting electrode is connected with a first terminal of the second portion of the eighteenth connecting electrode, a second terminal of the second portion of the eighteenth connecting electrode is connected with a first terminal of the third portion of the eighteenth connecting electrode, a second terminal of the third portion of the eighteenth connecting electrode is connected and integrally formed with a second electrode of the third transistor; the second terminal of the second portion of the eighteenth connecting electrode and the first terminal of the third portion of the eighteenth connecting electrode are connected with a first terminal of the second transfer electrode through a via hole penetrating through an insulating layer; and a second terminal of the second transfer electrode is connected with the fourth clock signal line through a via hole penetrating through an insulating layer.

For example, the display substrate provided by at least one embodiment of the present disclosure further comprises a nineteenth connecting electrode and a twentieth connecting electrode, wherein a first terminal of the nineteenth connecting electrode is connected with the gate electrode of the ninth transistor through a via hole penetrating through insulating layers, a second terminal of the nineteenth connecting electrode is connected with a first electrode of the third capacitor through a via hole penetrating through an insulating layer; a first terminal of the twentieth connecting electrode is connected and integrally formed with a second electrode of the first transistor; and a second terminal of the twentieth connecting electrode is connected with a second electrode of the third capacitor through a via hole penetrating through an insulating layer.

For example, in the display substrate provided by at least one embodiment of the present disclosure, the third node and the second node are a same node; or, the shift register unit further comprises a first on-off control circuit, the first on-off control circuit is electrically connected with the third node, the second node and the first voltage terminal, respectively, and the first on-off control circuit is configured to turn on or turn off a connection between the third node and the second node under control of a first voltage signal supplied by the first voltage terminal.

For example, in the display substrate provided by at least one embodiment of the present disclosure, the fourth node and the fifth node are a same node; or, the shift register unit further comprises a second on-off control circuit, the second on-off control circuit is electrically connected with the fourth node, the fifth node and the first voltage terminal, respectively, and the second on-off control circuit is configured to turn on or turn off a connection between the fourth node and the fifth node under control of the first voltage signal supplied by the first voltage terminal.

For example, in the display substrate provided by at least one embodiment of the present disclosure, the first on-off control circuit comprises a tenth transistor, and the second on-off control circuit comprises an eleventh transistor, an active layer of the tenth transistor extends along the second direction, a gate electrode of the tenth transistor extends along the first direction; and an active layer of the eleventh transistor extends along the second direction, and a gate electrode of the eleventh transistor extends along the first direction.

For example, the display substrate provided by at least one embodiment of the present disclosure further comprises a twenty-first connecting electrode, a twenty-second connecting electrode, a twenty-third connecting electrode, a twenty-fourth connecting electrode, and a seventh connecting line; wherein a first terminal of the twenty-first connecting electrode is connected and integrally formed with a first electrode of the second output transistor, a second terminal of the twenty-first connecting electrode is connected with the gate electrode of the tenth transistor through a via hole penetrating through an insulating layer, a third terminal of the twenty-first connecting electrode is connected with the gate electrode of the eleventh transistor through a via hole penetrating through an insulating layer and is connected with the third terminal of the first transfer electrode through a via hole penetrating through an insulating layer; a first terminal of the twenty-second connecting electrode is connected and integrally formed with a first electrode of the eleventh transistor, a second electrode of the eleventh transistor is connected and integrally formed with the nineteenth connecting electrode, a second terminal of the twenty-second connecting electrode is connected with a gate electrode of the fourth transistor through a via hole penetrating through an insulating layer; a first terminal of the twenty-third connecting electrode is connected and integrally formed with a first electrode of the tenth transistor, a second terminal of the twenty-third connecting electrode is connected with a first terminal of the seventh connecting line through a via hole penetrating through an insulating layer; a first terminal of the twenty-fourth connecting electrode is connected with the gate electrode of the eighth transistor through a via hole penetrating through an insulating layer, and a second terminal of the twenty-fourth connecting electrode is connected with a second terminal of the seventh connecting line through a via hole penetrating through an insulating layer.

For example, the display substrate provided by at least one embodiment of the present disclosure further comprises a twenty-fifth connecting electrode, a third transfer electrode, and a third intermediate transfer electrode; a first terminal of the twenty-fifth connecting electrode is connected and integrally formed with a second electrode of the first output transistor, a second terminal of the twenty-fifth connecting electrode is connected with a first terminal of the third transfer electrode through a via hole penetrating through an insulating layer and is connected with a first terminal of the third intermediate transfer electrode through a via hole penetrating through an insulating layer; a second terminal of the third transfer electrode is connected with gate electrodes of oxide transistors in a row of pixel units corresponding to the third transfer electrode; and a second terminal of the third intermediate transfer electrode is connected with a first electrode of a fifth transistor of a next-stage shift register unit through a via hole penetrating through an insulating layer.

For example, in the display substrate provided by at least one embodiment of the present disclosure, a second intermediate transfer electrode corresponding to a current-stage shift register unit and a third intermediate transfer electrode corresponding to a previous-stage shift register unit are integrally formed.

For example, the display substrate provided by at least one embodiment of the present disclosure further comprises an eighth connecting line and a ninth connecting line; wherein the eighth connecting line is connected with an output terminal of one shift register unit of the second gate drive circuit and a gate line corresponding to the one shift register unit of the second gate drive circuit; the ninth connecting line is connected with an output terminal of one shift register unit of the third gate drive circuit and a gate line corresponding to the one shift register unit of the third gate drive circuit.

For example, in the display substrate provided by at least one embodiment of the present disclosure, the first clock signal line is connected with a first clock signal terminal of a (2n−1)th-stage shift register unit to supply the first clock signal; and the second clock signal line is connected with a first clock signal terminal of a (2n)th-stage shift register unit to supply the first clock signal, n is an integer greater than or equal to 1 and less than or equal to N.

For example, in the display substrate provided by at least one embodiment of the present disclosure, he orthographic projection of the third clock signal line on the base substrate is located between the orthographic projection of the first output transistor on the base substrate and the orthographic projection of the fourth clock signal line on the base substrate; or the orthographic projection of the fourth clock signal line on the base substrate is located between the orthographic projection of the first output transistor on the base substrate and the orthographic projection of the third clock signal line on the base substrate.

A least one embodiment of the present disclosure provides a display apparatus, comprising the display substrate according to any one embodiment of the present disclosure.

BRIEF DESCRIPTION OF THE DRAWINGS

In order to clearly illustrate the technical solutions of the embodiments of the present disclosure, the drawings of the embodiments will be briefly described in the following; it is obvious that the described drawings are only related to some embodiments of the present disclosure and thus are not limitative to the present disclosure.

DETAILED DESCRIPTION

In order to make objects, technical solutions, and advantages of the embodiments of the present disclosure apparent, the technical solutions of the embodiments of the present disclosure will be described in a clearly and fully understandable way in connection with the drawings related to the embodiments of the present disclosure. Apparently, the described embodiments are just a part but not all of the embodiments of the present disclosure. Based on the described embodiments of the present disclosure, those skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

In order to keep the following description of the embodiments of the present disclosure clear and concise, the detailed description of some known functions and known components is omitted in this disclosure.

Figure 1A:
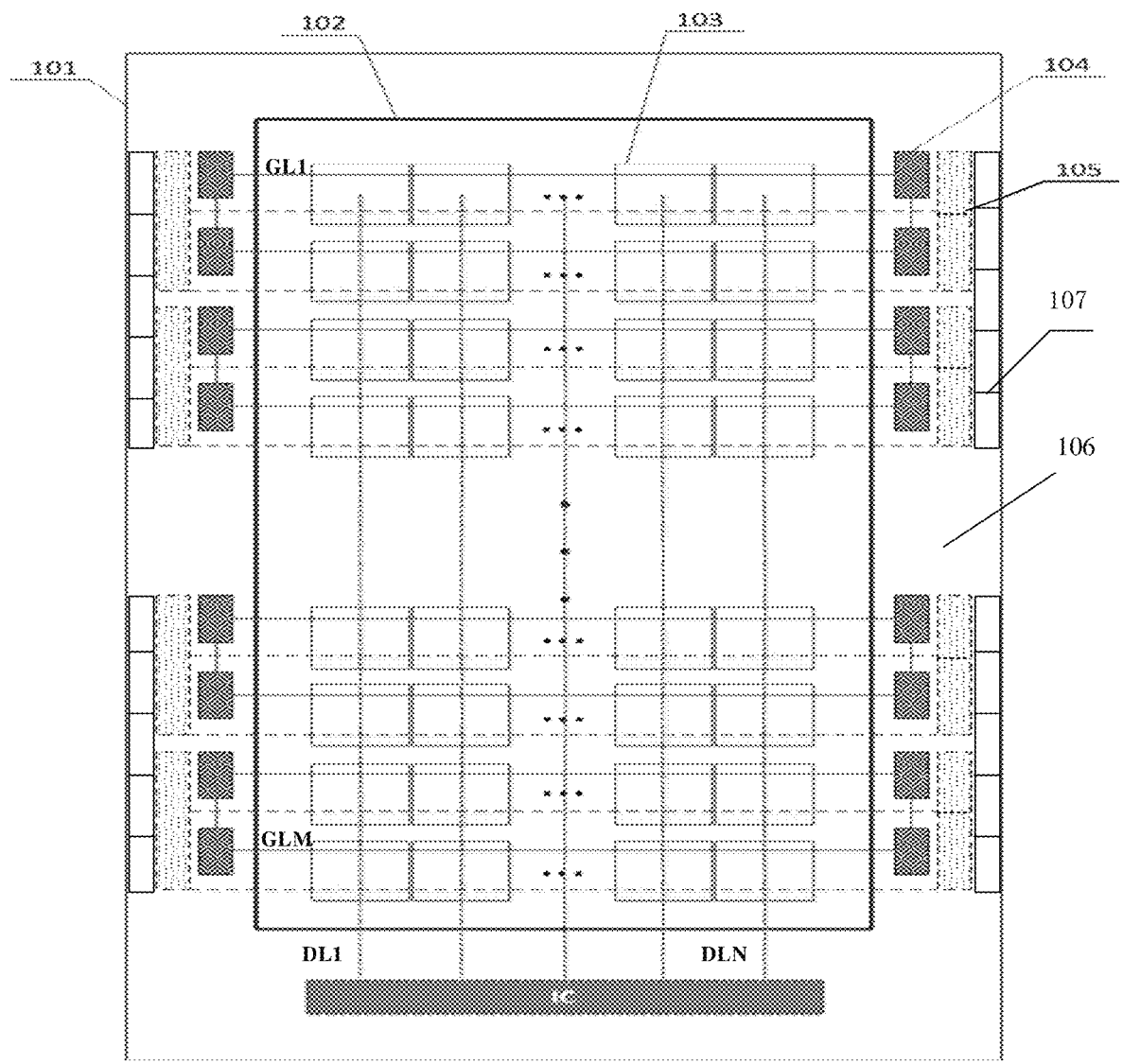
FIG. 1A is a schematic diagram of an overall circuit architecture of a display panel.

FIG. 1A is a schematic diagram of an overall circuit architecture of a display panel. For example, as shown in FIG. 1A, 101 represents an overall outer frame line of the display panel; the display panel includes a display region (i.e., a pixel array region) 102 and a peripheral region 106 located around the display region 102, the display region includes pixel units 103 arranged in an array; the peripheral region 106 includes a shift register unit 104, a plurality of cascaded shift register units 104 constitute a first gate drive circuit (e.g., a LTPO GOA), the first gate drive circuit is configured to be connected with gate electrodes of oxide transistors in a plurality of rows of pixel units 103, for example, to supply a first gate scan signal shifted row by row to the gate electrodes of the oxide transistors in the pixel units 103 arranged in an array in the display region 102 of the display panel 101; the peripheral region 106 further includes a shift register unit 105, and a plurality of cascaded shift register units 105 constitute a second gate drive circuit (e.g., a Gate GOA), the second gate drive circuit is configured to be connected with gate electrodes of data writing transistors in the plurality of rows of pixel units 103, to supply a second gate scan signal so as to control data writing of the pixel units; the peripheral region 106 further includes a shift register unit 107, and a plurality of cascaded shift register units 107 constitute a third gate drive circuit, the third gate drive circuit is configured to be connected with gate electrodes of light-emitting control transistors in the plurality of rows of pixel units 103 to control light-emitting elements in the pixel units 103 to emit light, for example, to supply a light-emitting control signal shifted row by row to the pixel units 103 arranged in an array in the display region 102 of the display panel 101, that is, the third gate drive circuit is a gate drive circuit for outputting a light-emitting control signal (i.e., an EM GOA).

As shown in FIG. 1A, data lines DL1 to DLN (N being an integer greater than 1) connected with a data driver chip IC longitudinally cross the display region 102 to supply data signals to the pixel units 103 arranged in an array; gate lines GL1 to GLM (M is an integer greater than 1) connected with the shift register unit 104, the shift register unit 105 and the shift register unit 107 laterally cross the display region 102 to supply a first gate scan signal, a second gate scan signal and a light-emitting control signal to the pixel units 103 arranged in an array. For example, each of the pixel units 103 may include a light-emitting element and a pixel circuit having circuit structures such as 7T1C, 8T2C, etc., in the art; the pixel circuit operates under control of the data signal transmitted through the data line and the first gate scan signal transmitted through the gate line, the second gate line and the light-emitting control signal, to drive the light-emitting element to emit light, so as to implement display and other operations. The light-emitting element may be, for example, an Organic Light emitting diode (OLED) or a Quantum Dot Light emitting diode (QLED).

Figure 1B:
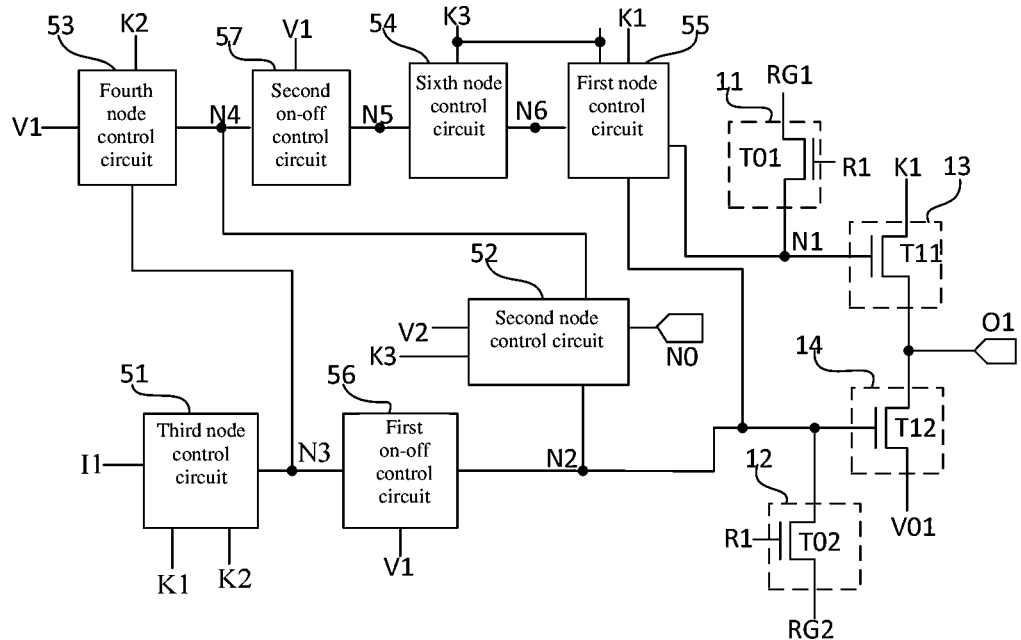
FIG. 1B is a structural schematic diagram of a shift register unit (i.e., a shift register unit 104) included in a first gate drive circuit provided by at least one embodiment of the present disclosure.
Figure 1C:
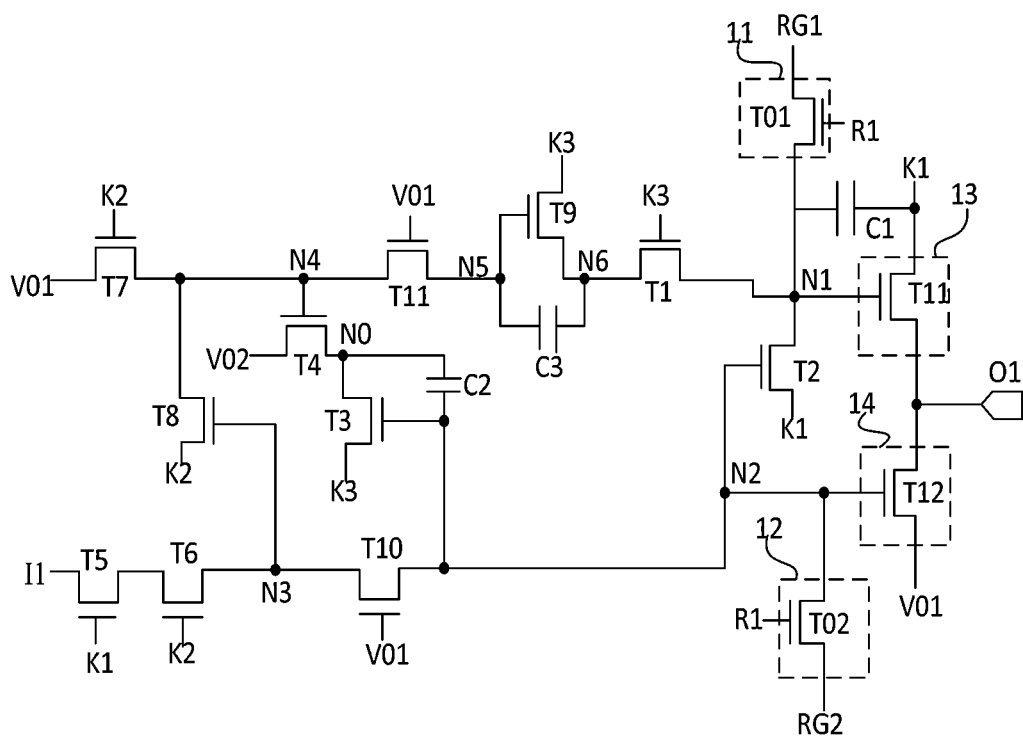
FIG. 1C is a circuit structure diagram of a specific implementation example of the shift register unit shown in FIG. 1B.
Figure 1D:
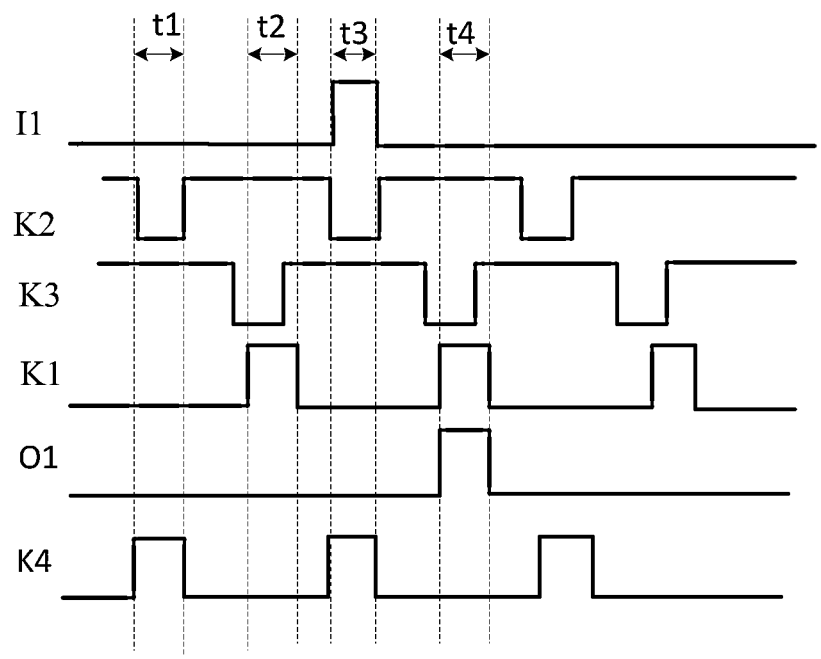
FIG. 1D is an operation timing diagram of the shift register unit shown in FIG. 1C.
Figure 1E:
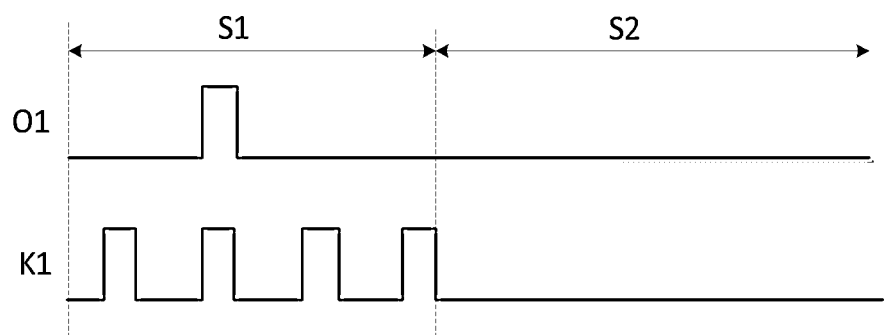
FIG. 1E is another operation timing diagram of the shift register unit shown in FIG. 1C.
Figure 1F:
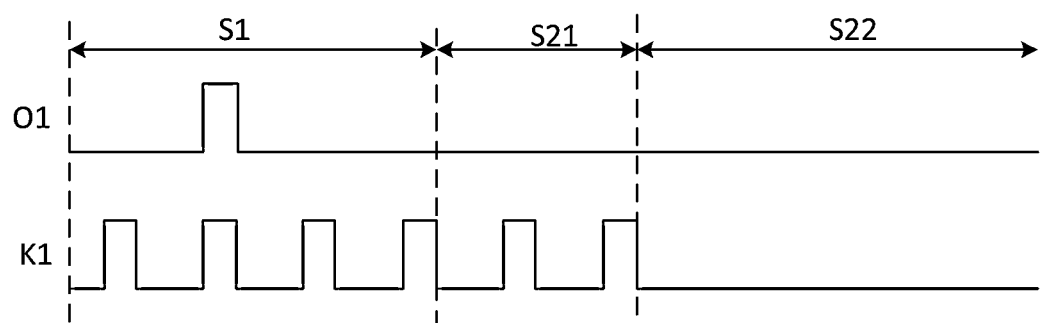
FIG. 1F is another operation timing diagram of the shift register unit shown in FIG. 1C.
Figure 1G:
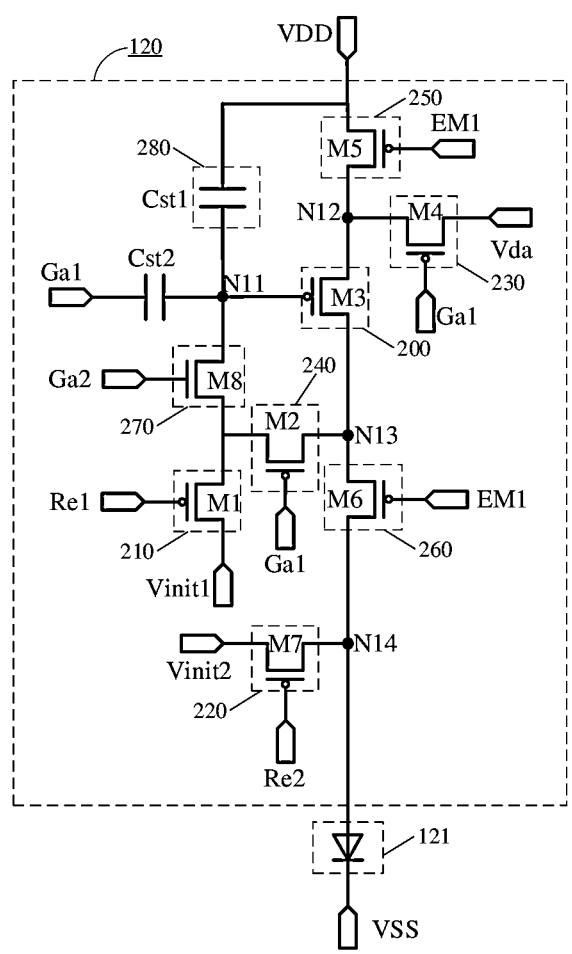
FIG. 1G is a structural schematic diagram of a pixel circuit of a pixel unit provided by at least one embodiment of the present disclosure.

FIG. 1G is a structural schematic diagram of a pixel circuit of a pixel unit provided by at least one embodiment of the present disclosure. For example, as shown in FIG. 1G, the pixel circuit 120 includes a driving sub-circuit 200, a first reset sub-circuit 210, a second reset sub-circuit 220, a data writing sub-circuit 230, a threshold compensation sub-circuit 240, a first light-emitting control sub-circuit 250, a second light-emitting control sub-circuit 260, a leak-proof sub-circuit 270 and a storage sub-circuit 280. Hereinafter, it is described by taking that the pixel circuit is a pixel circuit of 8T1C shown in FIG. 1G; and the pixel circuit may also be other pixel circuit having an oxide transistor, which will not be limited in the embodiments of the present disclosure.

For example, as shown in FIG. 1G, the driving sub-circuit 200 includes a control terminal, a first terminal and a second terminal, and is configured to control a driving current flowing through the light-emitting element 121. For example, the control terminal of the driving sub-circuit 200 is connected with a first node N11, the first terminal of the driving sub-circuit 200 is connected with a second node N12, and the second terminal of the driving sub-circuit 200 is connected with a third node N13.

The data writing sub-circuit 230 is connected with the first terminal of the driving sub-circuit 200, a data line Vda, and a gate line Ga1, and is configured to write a data signal supplied by the data line Vda into the first terminal of the driving sub-circuit 200 in response to a gate scan signal supplied by the gate line Ga1.

The threshold compensation sub-circuit 240 is connected with the second terminal of the driving sub-circuit 200, the leak-proof sub-circuit 270 and the gate line Ga1, and is configured to write a compensation signal based on the data signal into the control terminal of the driving sub-circuit 200 in response to the gate scan signal supplied by the gate line Ga1.

The leak-proof sub-circuit 270 is connected with the control terminal of the driving sub-circuit 200, the threshold compensation sub-circuit 240, the storage sub-circuit 280 and a leak-proof control signal line Ga2, and is configured to suppress the electric leakage of the control terminal of the driving sub-circuit 200.

The first light-emitting control sub-circuit 250 is connected with a first voltage line VDD, the first terminal of the driving sub-circuit 200 and a light-emitting control signal line EM1, and is configured to apply a first voltage supplied by the first voltage line VDD to the first terminal of the driving sub-circuit 200 in response to a light-emitting control signal supplied by the light-emitting control signal line EM1.

The second light-emitting control sub-circuit 260 is connected with the second terminal of the driving sub-circuit 200, a first terminal of the light-emitting element 121 and the light-emitting control signal line EM1, and is configured to apply a driving current to the first terminal of the light-emitting element 121 in response to the light-emitting control signal supplied by the light-emitting control signal line EM1.

The first reset sub-circuit 210 is connected with the threshold compensation sub-circuit 240, the leak-proof sub-circuit 270, a first initial signal line Vinit1 and a first reset control signal terminal Re1, and is configured to apply an initial voltage supplied by the first initial signal line to the control terminal of the driving sub-circuit 200 through the leak-proof sub-circuit 270 in response to a reset control signal received by the first reset control signal terminal Re1.

For example, when the first reset sub-circuit 240 transmits the initial voltage output by the first initial signal line Vinit1 to the control terminal of the driving sub-circuit 200 to initialize the control terminal of the driving sub-circuit 200, the leak-proof sub-circuit 270 is configured to be turned on under control of the leak-proof control signal, so that the initial voltage is transmitted to the control terminal (i.e., the first node N11) of the driving sub-circuit 200 via the leak-proof sub-circuit 270 to initialize the control terminal of the driving sub-circuit 200.

The second reset sub-circuit 220 is connected with a second initial signal line Vinit2, a second reset control signal terminal Re2 and the first terminal of the light-emitting element 121, and is configured to apply an initial voltage supplied by the second initial signal line Vinit2 to the first terminal of the light-emitting element 121 in response to a reset control signal received by the second reset control signal terminal Re2.

For example, the initial voltage supplied by the first initial signal line Vinit1 and the initial voltage supplied by the second initial signal line Vinit2 may be the same or different.

The storage sub-circuit 280 is connected with the control terminal of the driving sub-circuit 200 and the first voltage line VDD, and is configured to store and maintain the compensation signal at the control terminal of the driving sub-circuit 200.

For example, the storage sub-circuit 200 includes a storage capacitor Cst1, the storage capacitor Cst1 includes a first electrode plate, a second electrode plate and a third electrode plate; the first electrode plate and the third electrode plate are electrically connected with each other and located in different layers relative to the base substrate 10; the second electrode plate at least partially overlaps with the first electrode plate and the third electrode plate in a direction perpendicular to the base substrate 10, respectively. By arranging at least three stacked electrode plates and making the first electrode plate and the third electrode plate electrically connected with each other, that is, the first electrode plate and the third electrode plate have a same potential which is different from a potential of the second electrode plate, a storage capacitor with a three-layer structure is formed, which may increase an area of the storage capacitor and increase a capacitance value of the storage capacitor Cst1 without increasing occupied space. For example, the capacitance value of the storage capacitor according to the embodiment of the present disclosure may be increased from a capacitance value 60 pF of the existing two-layer capacitor to a capacitance value 100 fF.

In the embodiment of the present disclosure, in the pixel circuit including the driving sub-circuit 200, the first reset sub-circuit 210, the second reset sub-circuit 220, the data writing sub-circuit 230, the threshold compensation sub-circuit 240, the first light-emitting control sub-circuit 250, the second light-emitting control sub-circuit 260, the leak-proof sub-circuit 270 and the storage sub-circuit 280, the storage capacitor with at least three layers of electrode plates is adopted, which may effectively increase a size of the storage capacitor and increase the capacitance value of the storage capacitor without increasing the occupied space, further improve gate electrode potential stability of the drive transistor, and alleviate the problem of insufficient storage capacitance under a requirement of more pixels per inch.

For example, as shown in FIG. 1G, a second electrode of the light-emitting element 121 is electrically connected with a second voltage line VSS to receive a second voltage.

For example, the light-emitting element 121 may be a light emitting diode or the like. The light emitting diode may be a Micro Light Emitting Diode (Micro LED), an Organic Light Emitting Diode (OLED) or a Quantum Dot Light Emitting Diode (QLED), etc. The light-emitting element 121 is configured to receive a light-emitting signal (e.g., a driving current) during operation, and emit light with an intensity corresponding to the light-emitting signal. The light-emitting element 121 may include a first electrode, a second electrode, and a light emitting layer provided between the first electrode and the second electrode. The first electrode of the light-emitting element 121 may be an anode; and the second electrode of the light emitting diode may be a cathode. It should be noted that, in the embodiments of the present disclosure, the light emitting layer of the light-emitting element may include the electroluminescent layer per se and other common layers located on both sides of the electroluminescent layer, for example, a hole injection layer, a hole transport layer, an electron injection layer and an electron transport layer, etc. Usually, the light-emitting element 121 has an emission threshold voltage and emits light when a voltage between the first electrode and the second electrode of the light-emitting element 121 is greater than or equal to the emission threshold voltage. In practical applications, a specific structure of the light-emitting element 121 may be designed and determined according to an actual application environment, which will not be limited herein.

For example, as shown in FIG. 2A, the driving sub-circuit 200 includes a drive transistor M3; the first reset sub-circuit 210 includes a first reset transistor M1; the second reset sub-circuit 220 includes a second reset transistor M7; the data writing sub-circuit 230 includes a data writing transistor M4; the threshold compensation sub-circuit 240 includes a threshold compensation transistor M2; the first light-emitting control sub-circuit 250 includes a first light-emitting control transistor M5; the second light-emitting control sub-circuit 260 includes a second light-emitting control transistor M6, and the leak-proof sub-circuit 270 includes a leak-proof transistor M8.

The control terminal of the driving sub-circuit 200 includes a gate electrode of the drive transistor M3; the first terminal of the driving sub-circuit 200 includes a first electrode of the drive transistor M3; and the second terminal of the driver sub-circuit 20 includes a second electrode of the drive transistor M3. The gate electrode of the drive transistor M3 is electrically connected with the first node N11; the first electrode of the drive transistor M3 is electrically connected with the second node N12; and the second electrode of the drive transistor M3 is electrically connected with the third node N13.

A gate electrode of the data writing transistor M4 is electrically connected with a scan signal line Ga1; a first electrode of the data writing transistor M4 is electrically connected with the data line Vda; and a second electrode of the data writing transistor M4 is electrically connected with the second node N12, that is, electrically connected with the first electrode of the drive transistor M3.

A gate electrode of the threshold compensation transistor M2 is electrically connected with the scan signal line Ga1; a first electrode of the threshold compensation transistor M2 is electrically connected to a first electrode of the leak-proof transistor M8; and a second electrode of the threshold compensation transistor M2 is electrically connected to the third node N13, that is, electrically connected to the second electrode of the drive transistor M3.

A gate electrode of the first light-emitting control transistor M5 is electrically connected with the light-emitting control signal line EM1 to receive the light-emitting control signal; a first electrode of the first light-emitting control transistor M5 is electrically connected to the first voltage line VDD to receive the first voltage; and a second electrode of the first light-emitting control transistor M5 is electrically connected to the second node N12, that is, electrically connected to the first electrode of the drive transistor M3.

A gate electrode of the second light-emitting control transistor M6 is electrically connected with the light-emitting control signal line EM1 to receive the light-emitting control signal; a first electrode of the second light-emitting control transistor M6 is electrically connected to a fourth node N14, that is, electrically connected to the first electrode of the light-emitting element 121; and a second electrode of the second light-emitting control transistor M6 is electrically connected to the third node N13, that is, electrically connected to the second electrode of the drive transistor M3.

A gate electrode of the first reset transistor M1 is electrically connected with the first reset control signal terminal Re1; a first electrode of the first reset transistor M1 is electrically connected to a first electrode of the threshold compensation transistor M2 and a first electrode of the leak-proof transistor M8; and a second electrode of the first reset transistor M1 is electrically connected to the first initial signal line Vinit1.

A gate electrode of the second reset transistor M7 is electrically connected with the second reset control signal terminal Re2; a first electrode of the second reset transistor M7 is electrically connected to the second initial signal line Vinit2; and a second electrode of the second reset transistor M7 is electrically connected to the fourth node N14, that is, electrically connected to the first electrode of the light-emitting element 121.

A gate electrode of the leak-proof transistor M8 is electrically connected with the leak-proof control signal line Ga2; a first electrode of the leak-proof transistor M8 is electrically connected to the first electrode of the threshold compensation transistor M2 and the first electrode of the first reset transistor M1; and a second electrode of the leak-proof transistor M8 is electrically connected to the first node N11, that is, electrically connected to the gate electrode of the drive transistor M3.

For example, in a case where the leak-proof transistor M8 is not provided in the pixel circuit, the leakage path of the gate electrode of the drive transistor M3 is the transistor M1 and transistor M2; in order to suppress a leakage current, in some examples, the first reset transistor M1 and the threshold compensation transistor M2 may be set as double-gate transistors. In a case where the leak-proof transistor M8 is provided in the pixel circuit, leakage paths of the gate electrode of the drive transistor M3 are transistor M8 to transistor M1 and transistor M8 to transistor M2; as compared with the leakage path of transistor M1 and transistor M2 of the original pixel circuit, path leakage is lower and a leakage current of the leak-proof transistor M8 is a key reference index, so the first reset transistor M1 and the threshold compensation transistor M2 may be set as single-gate transistors to save space. The leak-proof transistor M8 may be an Oxide semiconductor Thin Film Transistor (Oxide TFT). The oxide semiconductor thin film transistor has characteristics of good hysteresis properties, low leakage current (below 1e-14 A), and at a same time, has low mobility, so the oxide semiconductor thin film transistor may be adopted to ensure stability of a gate voltage of the drive transistor.

For example, the first electrode plate CC1 and the third electrode plate CC3 of the storage capacitor Cst1 are both electrically connected to the control terminal of the driving sub-circuit 200; and the second electrode plate CC2 of the storage capacitor Cst1 is electrically connected to the first voltage line VDD to receive the first voltage. In the direction perpendicular to the base substrate 10, the second electrode plate is located between the first electrode plate and the third electrode plate.

For example, one of a voltage output by the first voltage line VDD and a voltage output by the second voltage line VSS is a high voltage, and the other is a low voltage. For example, in the embodiment shown in FIG. 2A, the voltage output by the first voltage line VDD is a constant first voltage, the first voltage is a positive voltage; the voltage output by the second voltage line VSS is a constant second voltage, and the second voltage is a negative voltage, etc. For example, in some examples, the second voltage line VSS may be grounded.

It should be noted that, the transistors adopted in the embodiments of the present disclosure may be thin film transistors or field effect transistors or other switching devices with same characteristics; and the thin film transistors may include oxide semiconductor thin film transistors, amorphous silicon thin film transistors or polysilicon thin film transistors, etc. For example, in description of the embodiment of the present disclosure, the drive transistor M3, the data writing transistor M4, the threshold compensation transistor M2, the first light-emitting control transistor M5, the second light-emitting control transistor M6, the first reset transistor M1, and the second reset transistor M7 may all be Low Temperature Poly-silicon (LTPS) thin film transistor, and the leak-proof transistor M8 may be an oxide semiconductor thin film transistor. A source electrode and a drain electrode of the transistor may be symmetrical in structure, so the source electrode and the drain electrode thereof may be indistinguishable in physical structure. In the embodiment of the present disclosure, in order to distinguish the transistors, in addition to the gate electrode as the control electrode, one of the electrodes is directly described as the first electrode and the other electrode as the second electrode, so the first electrode and the second electrode of all or part of the transistors according to the embodiment of the present disclosure are interchangeable as required.

It should be noted that, description in the art may be referred to for a specific operation process of the above-described pixel circuit, and no details will be repeated here.

For example, output terminals of respective stages of shift register units of the first gate drive circuit are connected with the gate electrode of the leak-proof transistor M8 to supply the first gate scan signal; the second gate drive circuit is connected with the gate electrode of the data writing transistor M4 to supply the second gate scan signal; and the third gate drive circuit is connected with the gate electrodes of the first light-emitting control transistor M5 and the second light-emitting control transistor M6 to supply the light-emitting control signal.

FIG. 1B is a structural schematic diagram of a shift register unit (i.e., a shift register unit 104) included in a first gate drive circuit provided by at least one embodiment of the present disclosure; FIG. 1C is a circuit structure diagram of a specific implementation example of the shift register unit shown in FIG. 1B; FIG. 1D is an operation timing diagram of the shift register unit shown in FIG. 1C; FIG. 1E is another operation timing diagram of the shift register unit shown in FIG. 1C; and FIG. 1F is another operation timing diagram of the shift register unit shown in FIG. 1C. The shift register unit of the first gate drive circuit provided by at least one embodiment of the present disclosure will be described in detail below in conjunction with FIG. 1B to FIG. 1F.

As shown in FIG. 1B, the shift register unit as described in at least one embodiment of the present disclosure includes a first control circuit 11, a second control circuit 12, a first output circuit 13, a second output circuit 14, an output terminal O1, a third node control circuit 51, a second node control circuit 52, a fourth node control circuit 53, a sixth node control circuit 54, a first node control circuit 55, a first on-off control circuit 56 and a second on-off control circuit 57.

For example, the first output circuit 13 is respectively electrically connected with the first node N1, a first clock signal terminal K1 and the output terminal O1, and is configured to turn on or turn off the connection between the output terminal O1 and the first clock signal terminal K1 under control of a potential of the first node N1.

For example, the second output circuit 14 is respectively electrically connected with the second node N2, the output terminal O1 and the first voltage terminal V1 (the low voltage terminal in FIG. 1B), and is configured to turn on or turn off the connection between the output terminal O1 and the first voltage terminal V1 under control of a potential of the second node N2.

For example, the first control circuit 11 is respectively electrically connected with a control terminal R1, the first node N1 and a first control voltage terminal RG1, and is configured to turn on or turn off the connection between the first node N1 and the first control voltage terminal RG1 under control of a control signal supplied by the control terminal R1.

For example, the second control circuit 12 is respectively electrically connected with the control terminal R1, the second node N2 and a second control voltage terminal RG2, and is configured to turn on or turn off the connection between the second node N2 and the second control voltage terminal RG2 under control of the control signal.

For example, the third node control circuit 51 is respectively electrically connected with the first clock signal terminal K1, the second clock signal terminal K2, the input terminal I1 and the third node N3, and is configured to turn on or turn off the connection between the third node N3 and the input terminal I1 under control of a first clock signal supplied by the first clock signal terminal K1 and a second clock signal supplied by the second clock signal terminal K2.

For example, the second node control circuit 52 is respectively electrically connected with the second node N2, the second voltage terminal V2, the fourth node N4, the third clock signal terminal K3 and the control node N0, and is configured to turn on or turn off the connection between the control node N0 and the second voltage terminal V2 under control of a potential of the fourth node N4, turn on or turn off the connection between the control node N0 and the third clock signal terminal K3 under control of a potential of the second node N2, and control the potential of the second node N2 according to the potential of the control node N0.

For example, the fourth node control circuit 53 is respectively electrically connected with the first voltage terminal V1, the second clock signal terminal K2, the fourth node N4 and the third node N3, and is configured to turn on or turn off the connection between the fourth node N4 and the first voltage terminal V1 under control of the second clock signal supplied by the second clock signal terminal K2, and turn on or turn off the connection between the fourth node N4 and the second clock signal terminal K2 under control of the potential of the third node N3.

For example, the sixth node control circuit 54 is respectively electrically connected with the fifth node N5, the third clock signal terminal K3 and the sixth node N6, and is configured to turn on or turn off the connection between the sixth node N6 and the third clock signal terminal K3 under control of a potential of the fifth node N5, and control a potential of the sixth node N6 according to the potential of the fifth node N5.

For example, the first node control circuit 55 is respectively electrically connected with the sixth node N6, the third clock signal terminal K3, the first node N1, the second node N2 and the first clock signal terminal K1, and is configured to turn on or turn off the connection between the sixth node N6 and the first node N1 under control of a third clock signal supplied by the third clock signal terminal K3, turn on or turn off the connection between the first node N1 and the first clock signal terminal K1 under control of the potential of the second node N2, and control the potential of the first node N1 according to the first clock signal supplied by the first clock signal terminal K1.

For example, the first on-off control circuit 56 is respectively electrically connected with the third node N3, the second node N2 and the first voltage terminal V1; and the first on-off control circuit 56 is configured to turn on or turn off the connection between the third node N3 and the second node N2 under control of the first voltage signal supplied by the first voltage terminal V1.

For example, the second on-off control circuit 57 is respectively electrically connected with the fourth node N4, the fifth node N5 and the first voltage terminal V1; and the second on-off control circuit 57 is configured to turn on or turn off the connection between the fourth node N4 and the fifth node N5 under control of the first voltage signal supplied by the first voltage terminal V1.

For example, as shown in FIG. 1C, the first control circuit 11 includes a first control transistor T01; a gate electrode of the first control transistor T01 is electrically connected with the control terminal R1; a source electrode of the first control transistor T01 is electrically connected with the first control voltage terminal RG1; and a drain electrode of the first control transistor T01 is electrically connected with the first node N1.

The second control circuit 12 includes a second control transistor T02; a gate electrode of the second control transistor T02 is electrically connected with the control terminal R1; a source electrode of the second control transistor T02 is electrically connected with the second control voltage terminal RG2; and a drain electrode of the second control transistor T02 is electrically connected with the second node N2.

The first output circuit 13 includes a first output transistor T11; the second output circuit includes a second output transistor T12; a gate electrode of the first output transistor T11 is electrically connected with the first node N1; a source electrode of the first output transistor T11 is electrically connected with the first clock signal terminal K1; a drain electrode of the first output transistor T11 is electrically connected with the output terminal O1; a gate electrode of the second output transistor T12 is electrically connected with the second node N2; a source electrode of the second output transistor T12 is electrically connected with a low voltage terminal V01; and a drain electrode of the second output transistor T12 is electrically connected with the output terminal O1.

For example, as shown in FIG. 1C, the first node control circuit includes a first transistor T1, a second transistor T2 and a first capacitor C1. A gate electrode of the first transistor T1 is electrically connected with the third clock signal terminal K3, a second electrode of the first transistor T1 is electrically connected with the sixth node N6, and a first electrode of the first transistor T1 is electrically connected with the first node N1; a gate electrode of the second transistor T2 is electrically connected with the second node N2, a second electrode of the second transistor T2 is electrically connected with the first clock signal terminal K1, and a first electrode of the second transistor T2 is electrically connected with the first node N1; a second electrode of the first capacitor C1 is electrically connected with the first node N1, and a first electrode of the first capacitor C1 is electrically connected with the first clock signal terminal K1.

The second node control circuit includes a third transistor T3, a fourth transistor T4 and a second capacitor C2; a gate electrode of the third transistor T3 is electrically connected with the second node N2, a first electrode of the third transistor T3 is electrically connected with the third clock signal terminal K3, a second electrode of the third transistor T3 is electrically connected with the control node N0; a gate electrode of the fourth transistor T4 is electrically connected with the fourth node N4, a second electrode of the fourth transistor T4 is electrically connected with a high voltage terminal V02, a first electrode of the fourth transistor T4 is electrically connected with the control node N0; a first electrode of the second capacitor C2 is electrically connected with the second node N2, and a second electrode of the second capacitor C2 is electrically connected with the control node N0.

The third node control circuit includes a fifth transistor T5 and a sixth transistor T6, the fourth node control circuit includes a seventh transistor T7 and an eighth transistor T8, the sixth node control circuit includes a ninth transistor T9 and a third capacitor C3. The gate electrode of the fifth transistor T5 is electrically connected with the first clock signal terminal K1, and a second electrode of the fifth transistor T5 is electrically connected with the input terminal I1.

A gate electrode of the sixth transistor T6 is electrically connected with the second clock signal terminal K2, a second electrode of the sixth transistor is electrically connected with the first electrode of the fifth transistor T5, a first electrode of the sixth transistor T6 is electrically connected with the third node N3; a gate electrode of the seventh transistor T7 is electrically connected with the second clock signal terminal K2, a second electrode of the seventh transistor T7 is electrically connected with the low voltage terminal V01, a first electrode of the seventh transistor T7 is electrically connected with the fourth node N4; a gate electrode of the eighth transistor T8 is electrically connected with the third node N3, a first electrode of the eighth transistor T8 is electrically connected with the second clock signal terminal K2, a second electrode of the eighth transistor T8 is electrically connected with the fourth node N4; a gate electrode of the ninth transistor T9 is electrically connected with the fifth node N5, a first electrode of the ninth transistor T9 is electrically connected with the third clock signal terminal K3, a second electrode of the ninth transistor T9 is electrically connected with the sixth node N6; a first electrode of the third capacitor C3 is electrically connected with the fifth node N5, and a second electrode of the third capacitor C3 is electrically connected with the sixth node N6.

The first on-off control circuit includes a tenth transistor T10; the second on-off control circuit includes an eleventh transistor T11; a gate electrode of the tenth transistor T10 is electrically connected with the low voltage terminal V01, a first electrode of the tenth transistor T10 is electrically connected with the third node N3, a second electrode of the tenth transistor T10 is electrically connected with the second node N2; a gate electrode of the eleventh transistor T11 is electrically connected with the low voltage terminal V01, a first electrode of the eleventh transistor T11 is electrically connected with the fourth node N4, and a second electrode of the eleventh transistor T11 is electrically connected with the fifth node N5.

In at least one embodiment of the shift register unit shown in FIG. 1C, the first voltage terminal is the low voltage terminal V01, and the second voltage terminal is the high voltage terminal V02, but the embodiments of the present disclosure are not limited to this.

The shift register unit includes, but is not limited to, configuration in FIG. 1C. For example, the respective transistors in the shift register unit 104 are P-type thin film transistors, or N-type transistors or a mixture of P-type transistors and N-type transistors, as long as ports of transistors of a selected type are connected simultaneously according to port polarities of the corresponding transistors according to the embodiment of the present disclosure.

It should be noted that, the transistors adopted in the shift register unit may all be thin film transistors or field effect transistors or other switch devices with same characteristics. Here, all is described by taking thin film transistors as an example, for example, an active layer (a channel region) of the transistor is made of a semiconductor material, for example, polysilicon (e.g., low-temperature polysilicon or high-temperature polysilicon), amorphous silicon, Indium Gallium Tin Oxide (IGZO), etc., while a gate electrode, a source electrode, and a drain electrode, etc. are made of metal materials, for example, metal aluminum or aluminum alloy. The source electrode and the drain electrode of the transistor adopted here may be symmetrical in structure, so the source electrode and the drain electrode thereof may be structurally indistinguishable. In the embodiment of the present disclosure, in order to distinguish the two electrodes of the transistor other than the gate electrode, one electrode is directly described as a first electrode and the other electrode as a second electrode. In addition, in the embodiment of the present disclosure, electrodes of the capacitor may be metal electrodes or one of the electrodes may be made of a semiconductor material (e.g., doped polysilicon).

As shown in FIG. 1D, in an embodiment of the present disclosure, when the shift register unit shown in FIG. 1C is operating, an operation period of the shift register unit may include a first stage t1, a second stage t2, a third stage t3 and a fourth stage t4.

In the first stage t1, the input terminal I1 supplies a low voltage signal, the potential of the first clock signal supplied by the first clock signal terminal K1 is a low voltage, the potential of the second clock signal supplied by the second clock signal terminal K2 is a low voltage, the potential of the third clock signal supplied by the third clock signal terminal K3 is a high voltage, the transistor T7 is turned on, the transistor T5 and the transistor T6 are turned on, the potential of N3 is a low voltage, the transistor T8 is turned on, the potential of N4 is a low voltage, the transistor T4 is turned on, the potential of N0 is a high voltage, the potential of N2 is a low voltage, the transistor T3 is turned on, the potential of N5 is a low voltage, the transistor T9 is turned on, the potential of N6 is a high voltage, the transistor T1 is turned off, the transistor T2 is turned on, the potential of N1 is a low voltage, the transistor T11 and the transistor T12 are both turned on, and the output terminal O1 outputs a low voltage signal.

In the second stage t2, the input terminal I1 supplies a low voltage signal, the potential of the first clock signal supplied by first clock signal terminal K1 is a high voltage, the potential of the second clock signal supplied by second clock signal terminal K2 is a high voltage, and the potential of the third clock signal supplied by third clock signal terminal K3 changes from a low voltage to a high voltage.

In the second stage t2, when the potential of the third clock signal is a low voltage, the transistor T6 is turned off, the potential of N3 is maintained as a low voltage, the transistor T7 is turned off, the transistor T8 is turned on, the potential of N4 is a high voltage, the potential of N5 is a high voltage, the transistor T4 is turned off, the potential of N2 is a low voltage, the transistor T2 is turned on, the potential of N1 is a high voltage, the transistor T11 is turned off, the transistor T12 is turned on, and the output terminal O1 outputs a low voltage signal.

In the third stage t3, the input terminal I1 supplies a high voltage signal, the potential of the first clock signal supplied by the first clock signal terminal K1 is a low voltage, the potential of the second clock signal supplied by second clock signal terminal K2 is a low voltage, the potential of the third clock signal supplied by third clock signal terminal K3 is a high voltage, the transistor T7 is turned on, the potential of N4 is a low voltage, the potential of N5 is a low voltage, the transistor T5 and the transistor T6 are both turned on, the potential of N3 is a high voltage, the potential of N2 is a high voltage, the transistor T8 is turned off, the transistor T4 is turned on, the transistor T3 is turned off, the transistor T9 is turned on, the potential of N6 is a high voltage, the transistor T1 is turned off, the transistor T11 and the transistor T12 are both turned off, and the output terminal O1 keeps outputting a low voltage signal.

In the fourth stage t4, the input terminal I1 supplies a low voltage signal, the potential of the first clock signal supplied by the first clock signal terminal K1 is a high voltage, the potential of the second clock signal supplied by the second clock signal terminal K2 is a high voltage, and the potential of the third clock signal supplied by the third clock signal terminal K3 changes from a low voltage to a high voltage.

In the fourth stage t4, when the potential of the third clock signal is a low voltage, the transistor T6 is turned off, the potential of N3 is maintained as a high voltage, the potential of N2 is a high voltage, the transistor T2 is turned off, the transistor T8 is turned off, the transistor T7 is turned off, the potential of N4 is maintained as a low voltage, the potential of N5 is a low voltage, the transistor T9 is turned on, the potential of N6 changes from a low voltage to a high voltage, the transistor T1 is turned on, the potential of N1 becomes −3 V (in the fourth stage t4, the transistor T1 and the transistor T9 are both turned on; because the p-type thin film transistor has threshold voltage loss when transmitting a low potential, the potential of N1 becomes −3 V), at this time, the potential of the first clock signal is 7 V, the transistor T11 is turned on, the transistor T12 is turned off, and the output terminal O1 outputs a high voltage signal.

For example, in other examples, in the second stage t2, when the potential of the third clock signal is a high voltage, the transistor T1 is turned off, the potential of N1 is maintained as a high voltage, the transistor T11 continues to be turned off, the potential of N2 is a low voltage, and the transistor T12 continues to be turned on.

In the fourth stage, when the potential of the third clock signal is a high voltage, the transistor T1 is turned off, the potential of N1 is maintained as a negative voltage, the transistor T11 continues to be turned on, the potential of N2 is a high voltage, and the transistor T12 continues to be turned off.

For example, in the above-described operation process, the transistor T11 may be normally turned on to prevent the potential of N2 from changing too much through voltage division, and T the transistor 12 may be normally turned on to prevent the potential of N5 from changing too much through voltage division.

In the present disclosure, when the shift register unit shown in FIG. 1C is operating, as shown in FIG. 1E, a driving cycle includes a driving stage S1 and a hold stage S2 which are set sequentially.

In the driving stage S1, the control terminal R1 supplies a high voltage signal, the first control voltage terminal RG1 and the second control voltage terminal RG2 supply a low voltage signal, the transistor T01 and the transistor T02 are both turned off, N1 and the first control voltage terminal RG1 are disconnected, and N2 and the second control voltage terminal RG2 are disconnected.

In the driving stage S1, the first clock signal terminal K1 supplies the first clock signal, and in the hold stage S2, the first clock signal terminal K1 keeps supplying the low voltage signal.

In the hold stage S2, the control terminal R1 supplies a low voltage signal, the first control voltage terminal RG1 and the second control voltage terminal RG2 supply a low voltage signal, the transistor T01 and the transistor T02 are both turned on, N1 and the first control voltage terminal RG1 are connected, and N2 and the second control voltage terminal RG2 are connected with each other to ensure that the potentials of N1 and N2 are both low voltages, so that in the hold stage S2, the first output transistor included in the first output circuit 13 and the second output transistor included in the second output circuit 14 are both turned on, to prevent abnormal driving.

In at least one embodiment of the present disclosure, when the first clock signal terminal K1 keeps supplying a low voltage signal in the hold stage S2, the first output transistor and the second output transistor may both be turned on in the hold stage S2, so that the output terminal O1 outputs the low voltage signal.

The shift register unit provided in at least one embodiment of the present disclosure may be applied to a display apparatus; and the shift register may be used to supply a first gate driving scan signal, and of course, may also be used to supply a second gate driving scan signal or a light-emitting control signal, but it is not limited thereto. Hereinafter, it is described by taking that the shift register unit shown in FIG. 1B is used to supply the first gate driving scan signal.

During specific implementation, when the display apparatus is driven at a low frequency, a driving cycle may include a driving stage and a hold stage. In the driving stage, the plurality of shift register units of the first gate drive circuit sequentially output gate driving scan signals; and in the hold stage, the plurality of shift register units of the first gate drive circuit all output the first voltage signal.

In at least one embodiment of the present disclosure, when the shift register unit is used to supply the first gate driving scan signal, the transistor whose gate electrode is connected to the gate driving scan signal in the pixel circuit of the pixel unit in the display apparatus is an n-type transistor, the first voltage signal may be a low voltage signal at this time; when the shift register unit is used to supply the second gate driving scan signal, the transistor whose gate electrode is connected to the gate driving scan signal in the pixel circuit in the display apparatus is a p-type transistor, and the first voltage signal may be a high voltage signal at this time; when the shift register unit is used to supply the light-emitting control signal, when the transistor whose gate electrode is connected to the light-emitting control signal in the pixel circuit in the display apparatus is an n-type transistor, the first voltage signal may be a low voltage signal; and when the transistor whose gate electrode is connected to the light-emitting control signal in the pixel circuit in the display apparatus is a p-type transistor, the first voltage signal may be a high voltage signal.

In at least one embodiment of the present disclosure, it is described by taking that the shift register unit is used to supply the first gate driving scan signal, and the transistor whose gate electrode is connected to the gate driving scan signal in the pixel circuit of the pixel unit in the display apparatus is an n-type transistor, and the first voltage signal is a low voltage signal.

In a case of driving at a low frequency (e.g., when lighting at 1 Hertz (Hz)), duration of the driving cycle may be time for 60 frames, duration of the driving stage may be time for 1 frame, duration of the hold stage may be time for 59 frames, and the hold stage may be a vertical blank period.

As shown in FIG. 1E, in one case, in an output stage of the shift register unit of a corresponding stage in the driving stage S1, a potential of the driving signal output by the output terminal O1 is a high voltage, and the first clock signal terminal K1 supplies the first clock signal; in the hold stage S2, the output terminal O1 outputs a low voltage signal, and the first clock signal terminal K1 keeps supplying a low voltage signal, which may save power consumption.

As shown in FIG. 1F, in another case, in an output stage of the shift register unit of a corresponding stage in the driving stage S1, the potential of the driving signal output by the output terminal O1 is a high voltage, and the first clock signal terminal K1 supplies the first clock signal; the hold stage S2 includes a first hold stage S21 and a second hold stage S22; in the first hold stage S21, the first clock signal terminal K1 supplies the first clock signal, and in the second hold stage S22, the first clock signal terminal K1 keeps supplying a low voltage signal to save power consumption.

In the related art, in the hold stage S2, when the first clock signal terminal K1 supplies a low voltage signal, because the first output transistor in the first output circuit 13 and the second output transistor in the second output circuit 14 are under voltage stress for a long time, it will cause characteristic drift of the first output transistor and characteristic drift of the second output transistor, so that the potential of the gate driving scan signal cannot be maintained as the first voltage, resulting in abnormal output of the shift register unit. Based on this, the shift register unit provided by at least one embodiment of the present disclosure adopts the first control circuit 11 and/or the second control circuit 12, so that in the hold stage S2, when the first clock signal terminal K1 keeps supplying a low voltage signal, the gate driving scan signal may be restored to the first voltage signal through the control of the first control circuit 11 and/or the second control circuit 12 when the gate driving scan signal is not the first voltage signal, so as to ensure operation stability of the shift register unit.

In addition, the inventor notices that, how to reduce load on the clock signal line and the load on the gate line during an operation process of the shift register unit and a process of supplying the gate driving scan signal to the pixel unit in the display region to improve driving ability of the display panel has become an urgent problem to be solved by those skilled in the art.

At least one embodiment of the present disclosure provides a display substrate, the display substrate includes: a base substrate, including a display region and a peripheral region located on at least one side of the display region; and a first gate drive circuit provided on the peripheral region of the base substrate; the first gate drive circuit includes a first clock signal line, a second clock signal line and N cascaded shift register units; each shift register unit includes a first control circuit, a second control circuit, a first output circuit, a second output circuit and an output terminal; the first output circuit is respectively electrically connected with a first node, a first clock signal terminal and an output terminal, and is configured to turn on or turn off the connection between the output terminal and the first clock signal terminal under control of a potential of the first node; the second output circuit is respectively electrically connected with a second node, the output terminal and a first voltage terminal, and is configured to turn on or turn off the connection between the output terminal and the first voltage terminal under control of a potential of the second node; the first control circuit is respectively electrically connected with the control terminal, the first node and the first control voltage terminal, and is configured to turn on or turn off the connection between the first node and the first control voltage terminal, under control of a control signal supplied by the control terminal; the second control circuit is respectively electrically connected with the control terminal, the second node and a second control voltage terminal, and is configured to turn on or turn off the connection between the second node and the second control voltage terminal under control of the control signal; the first clock signal line and the second clock signal line extend along a first direction on the base substrate, and are configured to supply a first clock signal to the first clock signal terminal of the shift register unit; the first clock signal line and the second clock signal line are not connected with a same shift register unit, the first output circuit includes a first output transistor; orthographic projections of the first clock signal line and the second clock signal line on the base substrate are located on a side of the first output transistor close to the display region, the orthographic projection of the second clock signal line on the base substrate is located between an orthographic projection of the first output transistor on the base substrate and the orthographic projection of the first clock signal line on the base substrate; and N is an integer greater than 1.

At least one embodiment of the present disclosure further provides a display apparatus corresponding to the above-described display substrate.

In the display substrate provided by at least one embodiment of the present disclosure, by changing positions of the first clock signal line CLK1 and the second clock signal line CLK2, load of the first clock signal line CLK1 and the second clock signal line CLK2 may be reduced, thereby improving drive capability of the display substrate.

The embodiments of the present disclosure and some examples thereof will be described in detail below in conjunction with the accompanying drawings.

Figure 2:
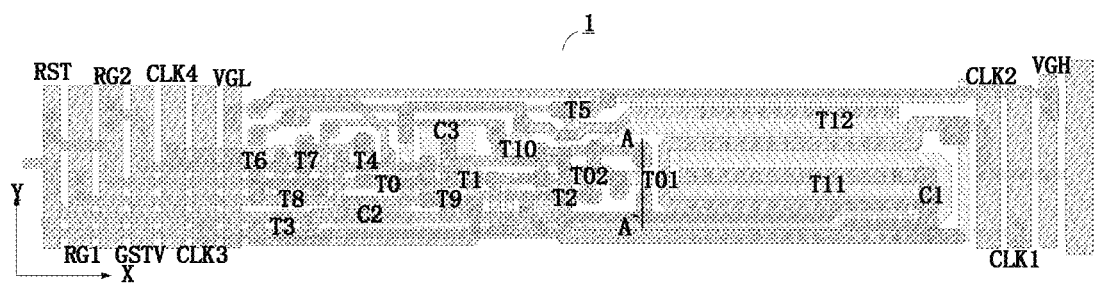
FIG. 2 is a schematic diagram of layout of the shift register unit 104 shown in FIG. 1C on a display substrate.

At least one embodiment of the present disclosure provides a display substrate. FIG. 2 is a schematic diagram of layout of the shift register unit 104 shown in FIG. 1C on the display substrate.

For example, as shown in FIG. 1A, the display substrate 1 includes: a base substrate 10 which includes a display region 102 and a peripheral region 106 located on at least one side of the display region 102; and a first gate drive circuit (LTPO GOA), a first clock signal line CLK1 and a second clock signal line CLK2 arranged on the peripheral region of the base substrate 10.

For example, the first gate drive circuit includes N cascaded shift register units 104. For convenience and brevity, it is introduced below by taking the shift register unit 104 as an example.

For example, as shown in FIG. 1B and FIG. 1C, each shift register unit includes a first control circuit, a second control circuit, a first output circuit, a second output circuit, and an output terminal; introduction of the above-described FIG. 1B and FIG. 1C may be referred to for introduction of the first control circuit, the second control circuit, the first output circuit, and the second output circuit of the shift register unit, and no details will be repeated here.

For example, the first clock signal line CLK1 and the second clock signal line CLK2 extend in a first direction Y on the base substrate 10, and are configured to supply a first clock signal to the first clock signal terminal K1 of the shift register unit; and the first clock signal line CLK1 and the second clock signal line CLK2 are not connected with the same shift register unit. For example, the first clock signal line CLK1 is connected with a first clock signal terminal K1 of a (2n−1)th-stage (n being an integer greater than or equal to 1 and less than or equal to N) shift register unit to supply a first clock signal; the second clock signal line CLK2 is connected with the first clock signal terminal K1 of a (2n)th-stage shift register unit to supply a first clock signal. For example, the first clock signal terminal K1 (as shown in FIG. 1B) of the first-stage shift register unit (not shown) is connected with the first clock signal line CLK1 to receive the first clock signal, and the first clock signal terminal K1 of the second-stage shift register unit (not shown) is connected with the second clock signal line CLK2 to receive the first clock signal. It should be noted that, a mode of connection between the respective stages of shift register units and the clock signal lines may also be other connection mode in the art, which will not be limited in the embodiments of the present disclosure. For example, an input terminal I1 of the first-stage shift register unit is connected with a trigger signal line (GSTV) to receive a trigger signal as an input signal; an input terminal of the second-stage shift register unit is connected with an output terminal O1 of a previous-stage shift register unit (i.e., the first-stage shift register unit), and connection modes of the other respective stages of shift register units are similar thereto. Hereinafter, it is described by taking a structure of an (n+1)th-stage shift register unit 105 as an example, which will not be limited in the embodiment of the present disclosure.

For example, the first output circuit 13 includes a first output transistor T11; and orthographic projections of the first clock signal line CLK1 and the second clock signal line CLK2 on the base substrate 10 are located on a side of the first output transistor T11 that is close to the display region 103; and the orthographic projection of the second clock signal line CLK2 on the base substrate 10 is located between the orthographic projection of the first output transistor T11 on the base substrate 10 and the orthographic projection of the first clock signal line CLK1 on the base substrate 10. N is an integer greater than 1, and n is an integer greater than or equal to 1 and less than or equal to N.

In the embodiment of the present disclosure, the first clock signal line CLK1 and the second clock signal line CLK2 connected with the first output transistor T11 are arranged between the first output transistor T11 and the display region 102, that is, a position close to the first output transistor T11, so as to avoid long connecting lines between the first output transistor T11 and the first clock signal line CLK1 and the second clock signal line CLK2 due to long distances therebetween, to avoid the load on the first clock signal line CLK1 and the second clock signal line CLK2 caused by the long connecting line, and reduce load on the first clock signal line CLK1 and the second clock signal line CLK2, thereby ensuring accuracy of the gate driving scan signal output by the shift register unit 104, and improving driving capability of the shift register unit.

For example, as shown in FIG. 2, the display substrate 1 further includes a third clock signal line CLK3 and a fourth clock signal line CLK4 extending along the first direction Y.

For example, the shift register unit 104 further includes a second node control circuit and a third node control circuit; introduction of the above-described FIG. 1B and FIG. 1C may be referred to for introduction of the second node control circuit and the third node control circuit of the shift register unit, and no details will be repeated here.

For example, the third clock signal line CLK3 is connected with a second clock signal terminal K2 of the (2n)th-stage shift register unit to supply the second clock signal; the fourth clock signal line CLK4 is connected with a third clock signal terminal K3 of the (2n)th-stage shift register unit to supply a third clock signal. The fourth clock signal line CLK4 is connected with the second clock signal terminal K2 of the (2n−1)th-stage shift register unit to supply a second clock signal; and the third clock signal line CLK3 is connected with the third clock signal terminal K3 of the (2n−1)th-stage shift register unit to supply a third clock signal.

For example, orthographic projections of the third clock signal line CLK3 and the fourth clock signal line CLK4 on the base substrate 10 are located on a side of the first output transistor T11 that is away from the display region 102; and the orthographic projection of the third clock signal line CLK3 on the base substrate 10 is located between the orthographic projection of the first output transistor T11 on the base substrate 10 and the orthographic projection of the fourth clock signal line CLK4 on the base substrate 10; or the orthographic projection of the fourth clock signal line CLK4 on the base substrate 10 is located between the orthographic projection of the first output transistor T11 on the base substrate 10 and the orthographic projection of the third clock signal line CLK3 on the base substrate 10.

For example, as shown in FIG. 2, the display substrate 1 further includes a second gate drive circuit (Gate GOA) and a third gate drive circuit (EM GOA).

For example, the display region 102 includes a plurality of rows and a plurality of columns of pixel units; and the first gate drive circuit (LTPO GOA) is configured to be connected with gate electrodes of oxide transistors in the plurality of rows of pixel units, e.g., connected with the leak-proof transistor M8 as shown in FIG. 1G.

For example, the second gate drive circuit is configured to be connected with gate electrodes of data writing transistors in the plurality of rows of pixel units (e.g., connected with the data writing transistor M4 shown in FIG. 1G) to control writing data of the pixel units.

For example, the third gate drive circuit is configured to be connected with the gate electrodes of light-emitting control transistors in the plurality of rows of pixel units (e.g., connected with the first light-emitting control transistor M5 and the second light-emitting control transistor M6 shown in FIG. 1G) to control light emission of the light-emitting elements 121 in the pixel units.

For example, as shown in FIG. 1A, orthographic projections of the second gate drive circuit (e.g., Gate GOA) and the third gate drive circuit (i.e., EM GOA) on the base substrate 10 are located on a side of an orthographic projection of the first gate drive circuit (e.g., LTPO GOA) on the base substrate 10 that is away from the display region 102; the farther away from the display region, the longer the gate line and the greater the load on the gate line, so in the above-described mode of arranging the first gate drive circuit on the side closest to the display region, the length of the gate line is minimized, which avoids the gate line connected with the first gate drive circuit from overlapping with the second gate drive circuit and the third gate drive circuit, so that load on the gate line connected with the first gate drive circuit may be minimized.

As shown in FIG. 1A, an orthographic projection of the second gate drive circuit (e.g., Gate GOA) on the base substrate 10 is located between an orthographic projection of the third gate drive circuit (i.e., EM GOA) on the base substrate 10 and the orthographic projection of the first gate drive circuit (e.g., LTPO GOA) on the base substrate 10; it should be noted that, the positions of the second gate drive circuit and the third gate drive circuit are not limited to the arrangement mode shown in FIG. 1A, and an arrangement mode that the orthographic projection of the third gate drive circuit (i.e., EM GOA) on the base substrate 10 is located between the orthographic projection of the second gate drive circuit (e.g., Gate GOA) on the base substrate 10 and the orthographic projection of the first gate drive circuit (e.g., LTPO GOA) on the base substrate 10 may also be adopted, which will not be limited in the embodiment of the present disclosure.

For example, the base substrate 1010 may be made of glass, plastic, quartz or other suitable material, which will not be limited in the embodiments of the present disclosure.

It should be noted that, the embodiment of the present disclosure only schematically shows two clock signal lines (the first clock signal line CLK1 and the second clock signal line CLK2) connected with the first clock signal terminal K1, or may also include 4, 6, or 8 or more clock signal lines, which will not be limited in the embodiments of the present disclosure. Correspondingly, when the number of clock signal lines changes, connection relationship between the shift register unit 104 and the clock signal lines on the display substrate also changes accordingly. Design in the art may be referred to for specific details, and no details will be repeated here.

Figure 3:
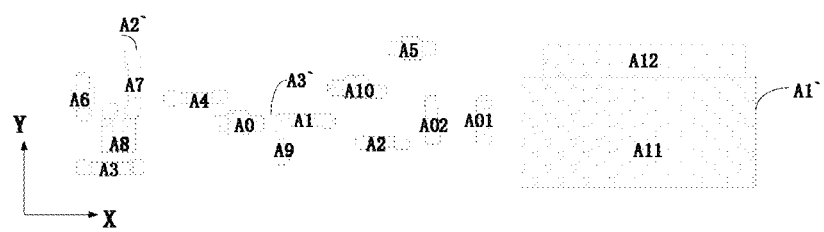
FIG. 3 is a plan view of a semiconductor layer of a display substrate provided by at least one embodiment of the present disclosure.
Figure 4:
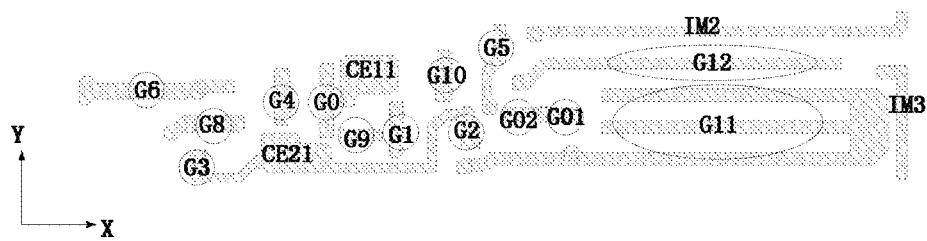
FIG. 4 is a plan view of a first conductive layer of the display substrate provided by at least one embodiment of the present disclosure.
Figure 5:
FIG. 5 is a plan view of a second conductive layer of the display substrate provided by at least one embodiment of the present disclosure.
Figure 6A:
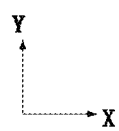
FIG. 6A is a plan view of a third conductive layer of the display substrate provided by at least one embodiment of the present disclosure.
Figure 6B:
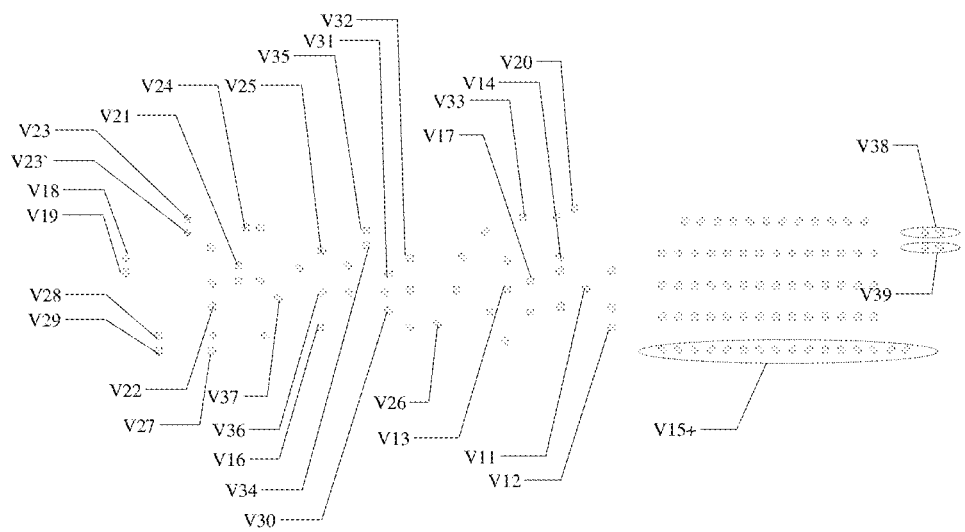
FIG. 6B is a distribution diagram of via holes of the display substrate provided by at least one embodiment of the present disclosure.
Figure 6C:
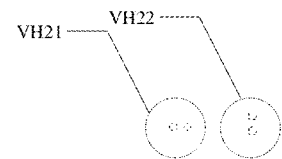
FIG. 6C is a distribution diagram of via holes of the display substrate provided by at least one embodiment of the present disclosure.
Figure 7A:
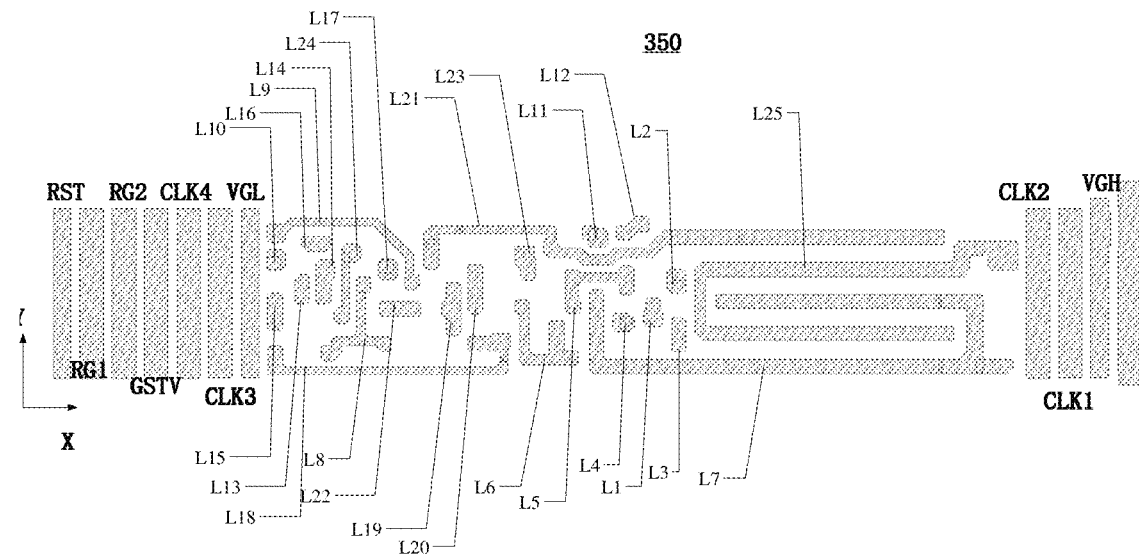
FIG. 7A is a plan view of a fourth conductive layer of the display substrate provided by at least one embodiment of the present disclosure.
Figure 7B:
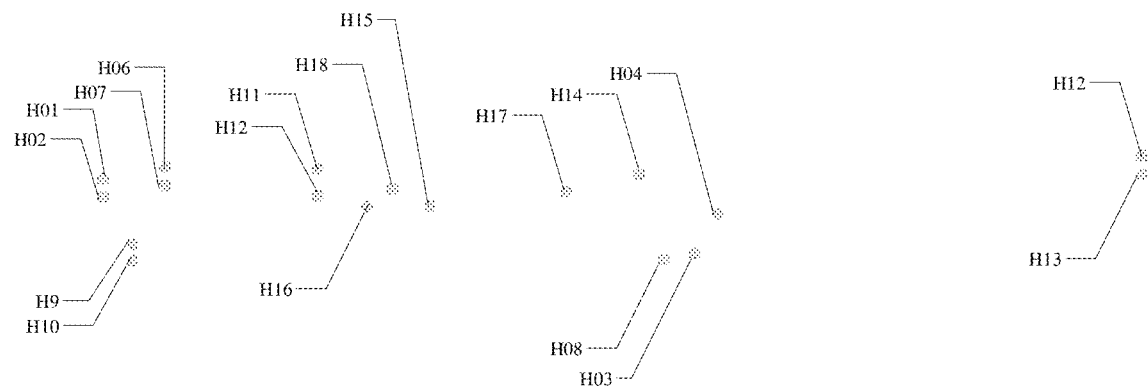
FIG. 7B is a distribution diagram of via holes of the display substrate provided by at least one embodiment of the present disclosure.
Figure 7C:
FIG. 7C is distribution diagram of via holes of the display substrate provided by at least one embodiment of the present disclosure.
Figure 8:
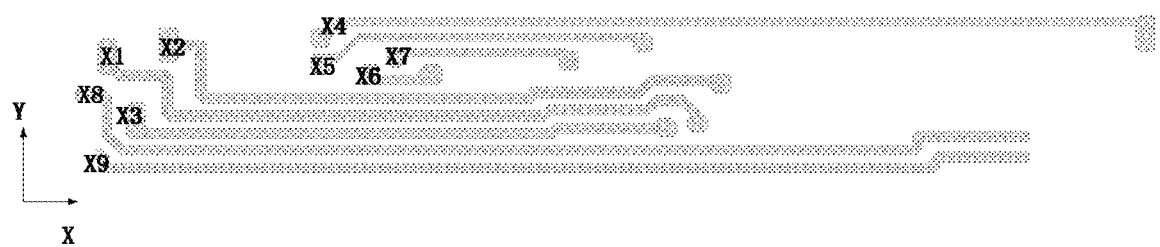
FIG. 8 is a plan view of a fifth conductive layer of the display substrate provided by at least one embodiment of the present disclosure.
Figure 9A:
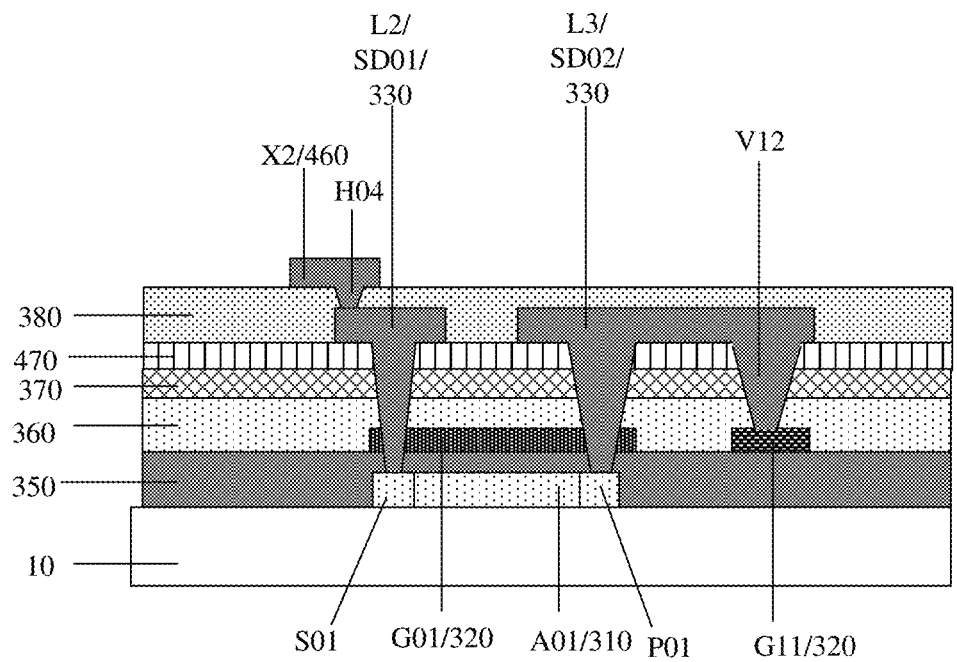
FIG. 9A is a cross-sectional view of some examples of the display substrate shown in FIG. 2 along a direction A-A'.
Figure 9B:
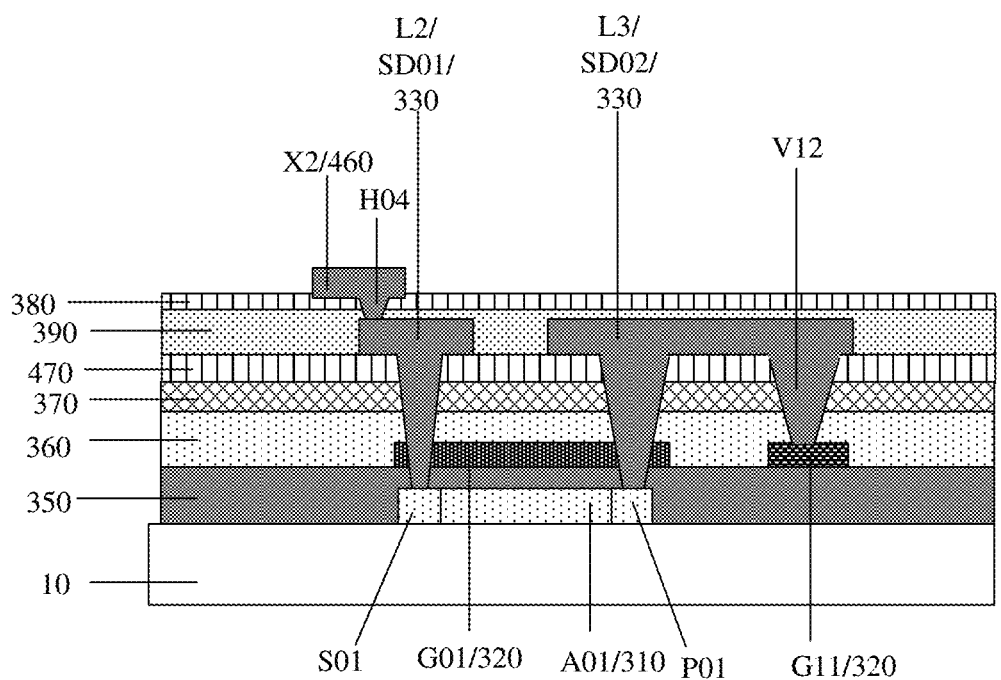
FIG. 9B is a cross-sectional view of other examples of the display substrate shown in FIG. 2 along the direction A-A'.

FIG. 3 to FIG. 8 respectively show plan views of wiring of respective layers of the display substrate shown in FIG. 2. FIG. 3 is a plan view of a semiconductor layer of a display substrate provided by at least one embodiment of the present disclosure; FIG. 4 is a plan view of a first conductive layer of a display substrate provided by at least one embodiment of the present disclosure; FIG. 5 is a plan view of a second conductive layer of a display substrate provided by at least one embodiment of the present disclosure; FIG. 6A is a plan view of a third conductive layer of a display substrate provided by at least one embodiment of the present disclosure; FIG. 6B is a distribution diagram of via holes of a display substrate provided by at least one embodiment of the present disclosure; FIG. 6C is a distribution diagram of via holes of a display substrate provided by at least one embodiment of the present disclosure; FIG. 7A is a plan view of a fourth conductive layer of a display substrate provided by at least one embodiment of the present disclosure; FIG. 7B is a distribution diagram of via holes of a display substrate provided by at least one embodiment of the present disclosure; and FIG. 8 is a plan view of a fifth conductive layer of a display substrate provided by at least one embodiment of the present disclosure. FIG. 9A is a cross-sectional view of some examples of the display substrate shown in FIG. 2 along a direction A-A'; and FIG. 9B is a cross-sectional view of other examples of the display substrate shown in FIG. 2 along the direction A-A'. The laminate structure of the display substrate provided by at least one embodiment of the present disclosure will be described in detail below in conjunction with FIG. 3 to FIG. 9B.

For example, an interlayer insulating layer (e.g., including a first insulating layer, a second insulating layer, a third insulating layer, a fourth insulating layer, a fifth insulating layer, etc.) may be located between the layer structures shown in FIG. 3 to FIG. 8. For example, the first insulating layer 350 (shown in FIG. 9A) is located between the semiconductor layer 310 shown in FIG. 3 and the first conductive layer 320 shown in FIG. 4; the second insulating layer 360 (shown in FIG. 9A) is located between the first conductive layer 320 shown in FIG. 4 and the second conductive layer 330 shown in FIG. 5; the third insulating layer 370 (shown in FIG. 9A) is located between the second conductive layer 330 shown in FIG. 5 and the third conductive layers 340 shown in FIG. 6A; and the fourth insulating layer 470 is located between the third conductive layer 340 shown in FIG. 6A and the fourth conductive layer 350 shown in FIG. 7A. The fifth insulating layer 380 is located between the fourth conductive layer 350 shown in FIG. 7A and the fifth conductive layer 460 shown in FIG. 8. The via holes shown in FIG. 6B to FIG. 6D are via holes respectively penetrating through one or more of the first insulating layer 350, the second insulating layer 360, the third insulating layer 370 or the fourth insulating layer 470; and FIG. 7B shows a via hole penetrating through the fifth insulating layer 380.

For example, as shown in FIG. 9B, the display substrate 1 further includes a sixth insulating layer 390; and the sixth insulating layer 390 is located on the fourth conductive layer 350 for shielding the fourth conductive layer 350. FIG. 7C shows a via hole penetrating through the sixth insulating layer 390.

For example, materials of the first insulating layer to the sixth insulating layer may include inorganic insulating materials such as SiNx, SiOx, SiNxOy, etc., organic insulating materials such as organic resins, or other suitable materials, which will not be limited in the embodiments of the present disclosure.

The display substrate provided by at least one embodiment of the present disclosure will be described in detail below in conjunction with FIG. 2 to FIG. 9A.

For example, active layers of the respective transistors of the shift register unit 104 shown in FIG. 2 may be formed on the semiconductor layer 310 shown in FIG. 3. The semiconductor layer 310 may be formed by patterning a semiconductor material. For example, as shown in FIG. 3, as required, the semiconductor layer 310 may be in a shape of a short rod or in a curved or bent shape, and may be used to fabricate the active layers of the above-described respective transistors. Each active layer may include a source region, a drain region, and a channel region located between the source region and the drain region. For example, the channel region has semiconductor properties; the source region and the drain region are located on both side of the channel region, may be doped with impurities and thus have conductivity. For example, the source region is a portion of the active layer; a metal electrode (e.g., located in the fourth conductive layer 350) in contact with the source region corresponds to a source electrode (or referred to a first electrode) of the transistor; the drain region is a portion of the active layer; and a metal electrode in contact with the drain region (e.g., located in the fourth conductive layer 350) corresponds to a drain electrode (or referred to as a second electrode) of the transistor. For example, the source region is connected with a metal electrode (a source electrode) corresponding thereto through a via hole penetrating through the first insulating layer 350, the second insulating layer 360 and the third insulating layer 370; and the drain region is connected with a metal electrode (a drain electrode) corresponding thereto through a via hole penetrating through the first insulating layer 350, the second insulating layer 360 and the third insulating layer 370.

For example, as shown in FIG. 9A and FIG. 9B, taking the first control transistor T01 as an example, an active layer of a first control transistor T01 includes a source region S01, a drain region P01 and a channel region; and the first control transistor T01 further includes a gate electrode G01, for example, the gate electrode G01 is located in the first conductive layer 320, the rest of the transistors are similar thereto, and no details will be repeated here.

For example, a material of the semiconductor layer 310 may include an oxide semiconductor, an organic semiconductor or amorphous silicon, polysilicon, etc. For example, the oxide semiconductor includes a metal oxide semiconductor (e.g., Indium Gallium Zinc Oxide (IGZO)), and polysilicon includes low-temperature polysilicon or high-temperature polysilicon, etc., which will not be limited in the embodiments of the present disclosure. It should be noted that, the above-described source region and drain region may be regions doped with an n-type impurity or a p-type impurity, which will not be limited in the embodiments of the present disclosure.

It should be noted that, in other examples, the first electrodes and the second electrodes of the respective transistors may also be located in other conductive layers, and connected with active layers corresponding thereto through via holes located in the insulating layer between the same and the semiconductor layer, which will not be limited in the embodiments of the present disclosure.

FIG. 4 shows the first conductive layer 320 of the display substrate; the first conductive layer 320 is provided on the first insulating layer so as to be insulated from the semiconductor layer 310. For example, the first conductive layer 320 may include the first electrode CE11 of the first capacitor C1, the first electrode CE12 of the second capacitor C2, the first electrode CE13 of the third capacitor C3, gate electrodes of the respective transistors, and respective traces directly connected with the gate electrodes, as well as intermediate transfer electrodes (e.g., a second intermediate transfer electrode IM2 and a third intermediate transfer electrode IM3); correspondingly, the first insulating layer 350 also serves as a gate insulating layer. As shown in FIG. 4, the gate electrodes of the respective transistors are portions surrounded by a circle or an oval dotted circle, that is, portions where the semiconductor layer structures of the respective transistors overlap with the lines on the first conductive layer 320.

FIG. 5 shows the second conductive layer 330 of the display substrate; the second conductive layer 330 includes the second electrode CE21 of the first capacitor C1, the second electrode CE22 of the second capacitor C2, the second electrode CE23 of the third capacitor C3, as well as a first transfer electrode E1 to a third transfer electrode E3. The second electrode CE12 at least partially overlaps with the first electrode CE11 to form the first capacitor C1; the second electrode CE22 at least partially overlaps with the first electrode CE21 to form the second capacitor C2; and the second electrode CE32 at least partially overlaps with the first electrode CE31 to form the third capacitor C3.

FIG. 6A shows the third conductive layer 340 of the display substrate; and the third conductive layer includes the first intermediate transfer electrode IM1.

FIG. 7A shows the fourth conductive layer 350 of the display substrate; the fourth conductive layer 350 includes a plurality of signal lines (e.g., a trigger signal line (GSTV) connected with the input terminal of the first-stage shift register unit 104, the first clock signal line CLK1, the second clock signal line CLK2, the third clock signal line CLK3, the fourth clock signal line CLK4, a reset signal line RST), a second power line VGH, a first power line VGL, the first control voltage line RG1 and the second control voltage line RG2, etc. It should be noted that, the fourth conductive layer 350 further includes a first connecting electrode L1 to a twenty-fifth connecting electrode L25, etc. connected between the respective transistors, capacitors and signal lines.

FIG. 8 shows the fifth conductive layer 460 of the display substrate; and the fifth conductive layer 460 includes a first connecting line X1 to a ninth connecting line X9.

As shown in FIG. 2 to FIG. 8, the plurality of signal lines, the second power line VGH, and the first power line VGL are connected with the transistors and the capacitors that need to be connected therewith in other respective layers through at least one via hole shown in FIG. 6C; the respective transistors and capacitors are also connected through at least one via hole, or bridged through transfer electrodes, connecting electrodes, etc., and no details will be repeated here.

For example, a material of the above-described fourth conductive layer 350 may include titanium, a titanium alloy, aluminum, an aluminum alloy, copper, a copper alloy or any other suitable composite material, which will not be limited in the embodiments of the present disclosure. For example, the materials of the first conductive layer 320, the second conductive layer 330, the third conductive layer 340 and the fifth conductive layer 460 may be the same as the material of the fourth conductive layer 350, and no details will be repeated here.

It should be noted that, the shift register unit according to the embodiment of the present disclosure includes the above-described respective transistors, capacitors, and adapt electrodes connecting the respective transistors and capacitors, etc., which will not be limited in the embodiments of the present disclosure.

FIG. 2 shows a schematic diagram of stacking positional relationship between the semiconductor layer 310 shown in FIG. 3, the first conductive layer 320 shown in FIG. 4, the second conductive layer 330 shown in FIG. 5, the third conductive layer 340 shown in FIG. 6A, the fourth conductive layer 350 shown in FIG. 7A, and the fifth conductive layer 460 shown in FIG. 8. The display substrate provided by at least one embodiment of the present disclosure will be described in detail below in conjunction with FIG. 2 to FIG. 9A.

For example, as shown in FIG. 3, the second output circuit includes a second output transistor T12. An active layer of the first output transistor T11 and an active layer of the second output transistor T12 are located in a continuous first semiconductor layer A1'; the first semiconductor layer A1' extends along a first direction Y; for example, as shown in FIG. 4, a gate electrode of the first output transistor T11 and a gate electrode of the second output transistor T12 both extend along a second direction X different from the first direction Y; and the gate electrode of the first output transistor T11 includes a plurality of sub-gate electrodes arranged in parallel in the first direction.

For example, as shown in FIG. 3, the first control circuit includes a first control transistor T01, the second control circuit includes a second control transistor T02, an active layer A01 of the first control transistor and an active layer A02 of the second control transistor are arranged side by side in the second direction, for example, an active layer A01 of the first control transistor and an active layer A02 of the second control transistor may be parallel to each other, for example, both extend along the first direction Y; for example, an extension direction of the active layer A01 of the first control transistor and an extension direction of the active layer A02 of the second control transistor may also be unparalleled to each other, for example, may intersect with each other by a certain angle, for example, the intersection angle is less than or equal to 20°, or the angle between the two and a horizontal line is less than or equal to 20°, which will not be limited in the embodiments of the present disclosure, as long as the active layer A01 of the first control transistor and the active layer A02 of the second control transistor are arranged in a left-right structure.

For example, a gate electrode of the first control transistor T01 and a gate electrode of the second control transistor T02 are integrally formed and extend along the second direction X, for example, an orthographic projection of the first output transistor T11 on the base substrate 10 is located between an orthographic projection of the first control transistor T01 and the second control transistor T02 on the base substrate 10 and an orthographic projection of the second clock signal line CLK2 on the base substrate 10; and an orthographic projection of the first control transistor T01 on the base substrate 10 is located between an orthographic projection of the second control transistor T02 on the base substrate 10 and the orthographic projection of the first output transistor T11 on the base substrate 10.

For example, as shown in FIG. 2 and FIG. 7A, the display substrate 1 further includes a reset signal line RST, a first connecting electrode L1 and a first connecting line X1; the reset signal line RST extends along the first direction Y and is configured to be connected with the control terminal R1 of the first control circuit 11 and the control terminal R2 of the second control circuit 12 to supply a control signal; the first connecting line X1 extends along the second direction X; a first terminal of the first connecting line X1 is connected with the reset signal line RST through via holes (H01, H02) penetrating through an insulating layer (e.g., penetrating through the fifth insulating layer); and a second terminal of the first connecting line X1 is connected with a first terminal of the first connecting electrode L1 through a via hole H03 penetrating through an insulating layer (e.g., penetrating through the fifth insulating layer); the first connecting electrode L1 extends along the first direction Y; and a second terminal of the first connecting electrode L1 is connected with the gate electrode of the first control transistor T01 and the gate electrode of the second control transistor T02 through a via hole V11 penetrating through an insulating layer.

For example, the display substrate 1 further includes a first control voltage line RG1; the first control voltage line RG1 extends along the first direction Y, and is configured to be connected with the first control voltage terminal RG1 to supply the first control voltage; and an orthographic projection of the first control voltage line RG1 on the base substrate 10 is located on a side of an orthographic projection of the reset signal line RST on the base substrate 10 that is close to the display region 102.

For example, the display substrate 1 further includes a second connecting electrode L2 and a second connecting line X2. For example, as shown in FIG. 2, FIG. 9A and FIG. 9B, a first terminal of the second connecting electrode L2 is connected and integrally formed with the first electrode SD01 of the first control transistor T11; and a second terminal of the second connecting electrode L2 is connected with the first terminal of the second connecting line X2 through a via hole H04 penetrating through an insulating layer (e.g., penetrating through the fifth insulating layer).

For example, a second terminal of the second connecting line X2 is connected with the first control voltage line RG1 through via holes H06 and H07 penetrating through an insulating layer (e.g., penetrating through the fifth insulating layer).

For example, the display substrate 1 further includes a third connecting electrode L3; a first terminal of the third connecting electrode L3 is connected and integrally formed with the second electrode of the first control transistor T11; and a second terminal of the third connecting electrode L3 is connected with the gate electrode of the first output transistor T11 through a via hole V12 penetrating through insulating layers (e.g., the second insulating layer to the fourth insulating layer).

For example, the display substrate 1 further includes a second control voltage line RG2; the second control voltage line RG2 extends along the first direction Y, and is configured to be connected with the second control voltage terminal RG2 to supply the second control voltage; and an orthographic projection of the first control voltage line RG1 on the base substrate 10 is located between an orthographic projection of the second control voltage line RG2 on the base substrate 10 and an orthographic projection of the reset signal line RST on the base substrate 10.

For example, the display substrate 1 further includes a fourth connecting electrode L4 and a third connecting line X3; a first terminal of the fourth connecting electrode L4 is connected and integrally formed with the first electrode of the second control transistor T02; a second terminal of the fourth connecting electrode L4 is connected with the first terminal of the third connecting line X3 through a via hole H08 penetrating through an insulating layer (e.g., penetrating through the fifth insulating layer); and a second terminal of the third connecting line X3 is connected with the second control voltage line RG2 through via holes H09 and H10 penetrating through an insulating layer (e.g., penetrating through the fifth insulating layer).

For example, the shift register unit further includes a fourth node control circuit, a sixth node control circuit and a first node control circuit. Introduction of the above-described FIG. 1B and FIG. 1C may be referred to for introduction of the fourth node control circuit 53, the sixth node control circuit 54 and the first node control circuit 55 of the shift register unit, and no details will be repeated here.

For example, the first node control circuit 55 includes a first transistor T1, a second transistor T2 and a first capacitor C1; an active layer of the first transistor T1 extends along the second direction X, a gate electrode of the first transistor T1 extends along the first direction Y, an active layer of the second transistor T2 extends along the second direction X, an orthographic projection of the first capacitor C1 on the base substrate 10 is located between an orthographic projection of the active layer of the first output transistor T1 on the base substrate 10 and an orthographic projection of the second clock signal line CLK2 on the base substrate 10; in the second direction X, an orthographic projection of the second transistor T2 on the base substrate 10 is located between the orthographic projection of the first transistor T1 on the base substrate 10 and an orthographic projection of the second control transistor T12 on the base substrate 10.

For example, the display substrate 1 further includes a fifth connecting electrode L5; and the fifth connecting electrode L5 includes a first portion extending along the first direction Y and a second portion extending along the second direction X; a first terminal of the first portion of the fifth connecting electrode L5 is connected with a gate electrode of the second transistor T2 through a via hole V13 penetrating through insulating layers (e.g., the second insulating layer to the fourth insulating layer); a second terminal of the first portion of the fifth connecting electrode is connected with a first terminal of the second portion of the fifth connecting electrode L5; a second terminal of the second portion of the fifth connecting electrode L5 is connected and integrally formed with the second electrode of the second control transistor T02; and the second terminal of the second portion of the fifth connecting electrode L5 is further connected with the gate electrode of the second output transistor T12 through a via hole V14 penetrating through insulating layers (e.g., the second insulating layer to the fourth insulating layer).

For example, the display substrate 1 further includes a sixth connecting electrode L6; the sixth connecting electrode L6 has a "U" shape; a first terminal of the sixth connecting electrode L6 is connected and integrally formed with the first electrode of the first transistor T1; and a second terminal of the sixth connecting electrode L6 is connected and integrally formed with the first electrode of the second transistor T2.

For example, the display substrate 1 further includes a seventh connecting electrode L7 and a first intermediate transfer electrode IM1; a first portion of the seventh connecting electrode L7 extends along the first direction Y, and is connected and integrally formed with the second electrode of the second transistor T2; a second portion of the seventh connecting electrode L2 extends along the second direction X, and is connected with the gate electrode of the first output transistor T11 and the first electrode CE11 of the first capacitor C1 through a via hole V15+ penetrating through insulating layers (e.g., the second insulating layer to the fourth insulating layers).

A third portion of the seventh connecting electrode L7 is connected with the first terminal of the first intermediate transfer electrode IM1 through a via hole VH21 penetrating through an insulating layer (e.g., the fourth insulating layer); and a second terminal of the first intermediate transfer electrode IM1 serves as the first clock signal terminal K1 and is connected with the first clock signal line CLK1 or the second clock signal line CLK2 through a via hole VH22 penetrating through an insulating layer.

For example, in the example shown in FIG. 2, the second terminal of the first intermediate transfer electrode IM1 serves as the first clock signal terminal K1 and is connected with the second clock signal line CLK2 through a via hole VH22 penetrating through an insulating layer.

For example, the second node control circuit 52 includes a third transistor T3, a fourth transistor T4 and a second capacitor C2. An active layer of the third transistor T3 extends along the second direction X, an active layer of the fourth transistor T4 extends along the second direction X; a gate electrode of the third transistor T3 and a gate electrode of the second transistor T2 are connected and integrally formed with the first electrode of the second capacitor C2; in the second direction, an orthographic projection of the fourth transistor T4 on the base substrate 10 is located between the orthographic projection of the first transistor T1 on the base substrate 10 and the orthographic projection of the third transistor T3 on the base substrate 10.

For example, the display substrate 1 further includes an eighth connecting electrode L8; a first terminal of the eighth connecting electrode L8 is connected and integrally formed with the first electrode of the third transistor T3; a second terminal of the eighth connecting electrode L8 is connected and integrally formed with the first electrode of the fourth transistor T4; and a third terminal of the eighth connecting electrode L8 is connected with the second electrode CE22 of the second capacitor C2 through a via hole V16 penetrating through insulating layers (e.g., the third insulating layer and the fourth insulating layer).

For example, the display substrate 1 further includes a second power line VGH; the second power line VGH extends along the first direction Y, and is configured to be connected with the second voltage terminal V02 to supply a second voltage signal; for example, an orthographic projection of the second power line VGH on the base substrate 10 is located on a side of an orthographic projection of the first clock signal line CLK1 on the base substrate 10 that is close to the display region 102.

For example, the display substrate 1 further includes a ninth connecting electrode L9 and a fourth connecting line X4; a first terminal of the ninth connecting electrode L9 is connected with the first terminal of the fourth connecting line X4 through a via hole H11 penetrating through an insulating layer (e.g., the fifth insulating layer); a second terminal of the ninth connecting electrode L9 is connected and integrally formed with the second electrode of the fourth transistor T4; and the second terminal of the fourth connecting line X4 is connected with the second power line VGH through via holes H12 and H13 penetrating through an insulating layer (e.g., the fifth insulating layer).

For example, the third node control circuit 51 includes a fifth transistor T5 and a sixth transistor T6; an active layer of the fifth transistor T5 extends along the second direction X; a gate electrode of the fifth transistor T5 extends along the first direction Y, and is connected with a first terminal of the seventh connecting electrode L7 through a via hole V17 penetrating through insulating layers (e.g., the second insulating layer to the fourth insulating layer); an active layer of the sixth transistor T6 extends along the first direction Y; a gate electrode of and the sixth transistor T6 extends along the second direction X; and a first terminal of the gate electrode of the sixth transistor T6 is connected with the third clock signal line CLK3 through via holes V18 and V19 penetrating through insulating layers (e.g., the second insulating layer to the fourth insulating layer).

For example, the display substrate 1 further includes a tenth connecting electrode L10, an eleventh connecting electrode L11, a twelfth connecting electrode L12, a fifth connecting line X5 and a second intermediate transfer electrode IM2. For example, the second intermediate transfer electrode is located on the first conductive layer shown in FIG. 4.

For example, a first terminal of the tenth connecting electrode L10 is connected with the first terminal of the fifth connecting line X5 through a via hole H12 penetrating through an insulating layer (e.g., the fifth insulating layer); a second terminal of the tenth connecting electrode L10 is connected and integrally formed with the second electrode of the sixth transistor T6; a first terminal of the eleventh connecting electrode L11 is connected with the second terminal of the fifth connecting line X5 through a via hole H14 penetrating through an insulating layer (e.g., the fifth insulating layer), a second terminal of the eleventh connecting electrode L11 is connected and integrally formed with the first electrode of the fifth transistor T5; a first terminal of the twelfth connecting electrode L12 is connected and integrally formed with the second electrode of the fifth transistor T5; and a second terminal of the twelfth connecting electrode L12 is connected with the first terminal of the second intermediate transfer electrode IM2 through a via hole V20 penetrating through insulating layers (e.g., the second insulating layer to the fourth insulating layer).

For example, as shown in FIG. 3 and FIG. 4, the fourth node control circuit 53 includes a seventh transistor T7 and an eighth transistor T8; a gate electrode of the seventh transistor T7 and a gate electrode of the sixth transistor T6 are integrally formed; an active layer of the seventh transistor T7 and an active layer of the eighth transistor T8 are located in a continuous second semiconductor layer A2'; the active layer A8 of the eighth transistor T8 has a "U" shape; and a gate electrode of the eighth transistor T8 extends along the second direction.

For example, as shown in FIG. 7A, the display substrate 1 further includes: a thirteenth connecting electrode L13, a fourteenth connecting electrode L14 and a fifteenth connecting electrode L15; a first terminal of the thirteenth connecting electrode L13 is connected with the gate electrode of the sixth transistor T6 through a via hole V21 penetrating through insulating layers (e.g., the second insulating layer to the fourth insulating layer), a second terminal of the thirteenth connecting electrode L13 is connected and integrally formed with the first electrode of the eighth transistor T8; a first terminal of the fourteenth connecting electrode L14 is connected and integrally formed with the first electrode of the seventh transistor T7; a second terminal of the fourteenth connecting electrode L14 is connected and integrally formed with the second electrode of the eighth transistor T8; a first terminal of the fifteenth connecting electrode L15 is connected and integrally formed with the first electrode of the sixth transistor T6; and a second terminal of the fifteenth connecting electrode L15 is connected with the gate electrode of the eighth transistor T8 through a via hole V22 penetrating through insulating layers (e.g., the second insulating layer to the fourth insulating layer).

For example, the display substrate 1 further includes a first power line VGL; the first power line VGL extends along the first direction Y, and is configured to be connected with the first voltage terminal V01 to supply a first voltage signal; and an orthographic projection of the first power line VGL on the base substrate 10 is located on a side of the orthographic projection of the third clock signal line CLK3 on the base substrate 10 that is close to the display region 102.

For example, the display substrate 1 further includes a first transfer electrode E1 and a sixteenth connecting electrode L16; a first terminal of the first transfer electrode E1 is connected with the first power line VGL through a via hole V23 penetrating through insulating layers (e.g., the third insulating layer to the fourth insulating layer); a first terminal of the sixteenth connecting electrode L16 is connected and integrally formed with the second electrode of the seventh transistor T7; and a second terminal of the sixteenth connecting electrode T16 is connected with the second terminal of the first transfer electrode E1 through a via hole V24 penetrating through insulating layers (e.g., the third insulating layer to the fourth insulating layer).

For example, as shown in FIG. 7A, the display substrate 1 further includes a seventeenth connecting electrode L17 and a sixth connecting line X6. For example, a first terminal of the seventeenth connecting electrode L17 is connected with the gate electrode of the fourth transistor T4 through a via hole V25 penetrating through insulating layers (e.g., the second insulating layer to the fourth insulating layer); a second terminal of the seventeenth connecting electrode L17 is connected with the first terminal of the sixth connecting line X6 through a via hole H15 penetrating through an insulating layer (e.g., the fifth insulating layer); a second terminal of the sixth connecting line X6 is connected with the first terminal of the fourteenth connecting electrode L14 through a via hole H16 penetrating through an insulating layer (e.g., the fifth insulating layer).

For example, the sixth node control circuit 54 includes a ninth transistor T9 and a third capacitor C3; an active layer A1 of the first transistor T1 and an active layer A9 of the ninth transistor T9 are located in a continuous third semiconductor layer A3'; an active layer of the ninth transistors T9 extends along the first direction Y; and a gate electrode of the ninth transistor T9 extends along the second direction X.

For example, the display substrate 1 further includes an eighteenth connecting electrode L18 and a second transfer electrode E2; the second transfer electrode E2 extends along the second direction X; the eighteenth connecting electrode L18 includes a first portion extending along the second direction X, a second portion extending along the second direction X and a third portion extending along the first direction Y; the first portion, the second portion and the third portion of the eighteenth connecting electrode L18 are integrally formed; a first terminal of the first portion of the eighteenth connecting electrode L18 is connected with the gate electrode of the first transistor T1 through a via hole V26 penetrating through insulating layers (e.g., the second insulating layer to the fourth insulating layer); a second terminal of the first portion of the eighteenth connecting electrode L18 is connected and integrally formed with the first electrode of the ninth transistor; a third terminal of the first portion of the eighteenth connecting electrode L18 is connected with a first terminal of the second portion of the eighteenth connecting electrode L18; a second terminal of the second portion of the eighteenth connecting electrode L18 is connected with a first terminal of the third portion of the eighteenth connecting electrode L18; a second terminal of the third portion of the eighteenth connecting electrode L18 is connected and integrally formed with the second electrode of the third transistor T3; the second terminal of the second portion of the eighteenth connecting electrode L18 and the first terminal of the third portion of the eighteenth connecting electrode L18 are connected with the first terminal of the second transfer electrode E2 through a via hole V27 penetrating through insulating layers (e.g., the third insulating layer and the fourth insulating layer); and a second terminal of the second transfer electrode E2 is connected with the fourth clock signal line CLK4 through via holes V28 and V29 penetrating through insulating layers (e.g., the third insulating layer and the fourth insulating layer).

For example, the display substrate 1 further includes a nineteenth connecting electrode L19 and a twentieth connecting electrode L20; a first terminal of the nineteenth connecting electrode L19 is connected with the gate electrode of the ninth transistor T9 through a via hole V30 penetrating through insulating layers (e.g., the second insulating layer to the fourth insulating layer); a second terminal of the nineteenth connecting electrode L19 is connected with the first electrode CE31 of the third capacitor C3 through a via hole V31 penetrating through insulating layers (e.g., the second insulating layer to the fourth insulating layer); a first terminal of the twentieth connecting electrode L20 is connected and integrally formed with the second electrode of the first transistor T1; and a second terminal of the twentieth connecting electrode L20 is connected with the second electrode CE32 of the third capacitor C3 through a via hole V32 penetrating through insulating layers (e.g., the third insulating layer to the fourth insulating layer).

For example, as shown in FIG. 3 and FIG. 4, the first on-off control circuit 56 includes a tenth transistor T10; the second on-off control circuit 57 includes an eleventh transistor T11; an active layer A10 of the tenth transistor T10 extends along the second direction X; a gate electrode G10 of the tenth transistor T10 extends along the first direction Y; an active layer A0 of the eleventh transistor T11 extends along the second direction X; and a gate electrode G0 of the eleventh transistor T11 extends along the first direction Y.

For example, the display substrate 1 further includes a twenty-first connecting electrode L21, a twenty-second connecting electrode L22, a twenty-third connecting electrode L23, a twenty-fourth connecting electrode L24, and a seventh connecting line X7; a first terminal of the twenty-first connecting electrode L21 is connected and integrally formed with the first electrode of the second output transistor T12; a second terminal of the twenty-first connecting electrode L21 is connected with the gate electrode of the tenth transistor T10 through a via hole V33 penetrating through insulating layers (e.g., the second insulating layer to the fourth insulating layer); a third terminal of the twenty-first connecting electrode L21 is connected with the gate electrode of the eleventh transistor T11 through a via hole V34 penetrating through insulating layers (e.g., the second insulating layer to the fourth insulating layer), and is connected with the third terminal of the first transfer electrode E1 through a via hole V35 penetrating through insulating layers (e.g., the third insulating layer to the fourth insulating layer); a first terminal of the twenty-second connecting electrode L22 is connected and integrally formed with the first electrode of the eleventh transistor T11; a second electrode of the eleventh transistor T11 is connected and integrally formed with the nineteenth connecting electrode L19 (e.g., a protruding portion of the nineteenth connecting electrode L19), a second terminal of the twenty-second connecting electrode L22 is connected with the gate electrode G4 of the fourth transistor T4 through a via hole V36 penetrating through insulating layers (e.g., the second insulating layer to the fourth insulating layer); a first terminal of the twenty-third connecting electrode L23 is connected and integrally formed with the first electrode of the tenth transistor T10; a second terminal of the twenty-third connecting electrode L23 is connected with a first terminal of the seventh connecting line X7 through a via hole H17 penetrating through an insulating layer (e.g., the fifth insulating layer); a first terminal of the twenty-fourth connecting electrode L24 is connected with the gate electrode G8 of the eighth transistor T8 through a via hole V37 penetrating through insulating layers (e.g., the second insulating layer to the fourth insulating layer); and a second terminal of the twenty-fourth connecting electrode L24 is connected with a second terminal of the seventh connecting line X7 through a via hole H18 penetrating through an insulating layer (e.g., the fifth insulating layer).

For example, as shown in FIG. 7A, FIG. 4 and FIG. 5, the display substrate 1 further includes a twenty-fifth connecting electrode L25, a third transfer electrode E3 and a third intermediate transfer electrode IM3; a first terminal of the twenty-fifth connecting electrode L25 is connected and integrally formed with the second electrode of the first output transistor T11; a second terminal of the twenty-fifth connecting electrode L25 is connected with a first terminal of the third transfer electrode E3 through a via hole V38 penetrating through insulating layers (e.g., the third insulating layer and the fourth insulating layer), and is connected with a first terminal of the third intermediate transfer electrode IM3 (e.g., located in the first conductive layer) through a via hole V39 penetrating through insulating layers (e.g., the second insulating layer to the fourth insulating layer); a second terminal of the third transfer electrode E3 is connected with gate electrodes of oxide transistors (e.g., the leak-proof transistor M8 in FIG. 1G) in a row of pixel units corresponding thereto; and a second terminal of the third intermediate transfer electrode IM3 is connected with a first electrode of a fifth transistor of a next-stage shift register unit through a via hole (e.g., V20) penetrating through an insulating layer. That is, the row of pixel units corresponding to the current-stage shift register unit and the third transfer electrode E3, for example, the current-stage shift register unit is the (m)th-stage shift register unit, and the next-stage shift register unit is the (m+1)th-stage shift register unit, m is an integer greater than or equal to 1 and less than or equal to N.

For example, a second intermediate transfer electrode IM2 corresponding to a current-stage shift register unit and a third intermediate transfer electrode IM3 corresponding to a previous-stage shift register unit are integrally formed, thereby implementing cascade connection between an upper-stage shift register and a lower-stage shift register. For example, when the current-stage shift register unit is the (l)th-stage shift register unit, the previous-stage shift register unit is the (l−1)th-stage shift register unit, l is an integer greater than or equal to 2 and less than or equal to N.

For example, as shown in FIG. 8, the display substrate 1 further includes an eighth connecting line X8 and a ninth connecting line X9; the eighth connecting line X8 is connected with an output terminal of one shift register unit of the second gate drive circuit and a gate line corresponding to the one shift register unit of the second gate drive circuit, so that a signal output by the second gate drive circuit may be output to a data writing transistor M4 shown in FIG. 1G; the ninth connecting line X9 is connected with an output terminal of one shift register unit of the third gate drive circuit and a gate line corresponding to the one shift register unit of the third gate drive circuit, so that a signal output by the third gate drive circuit may be output to the light-emitting control transistor M5 and the light-emitting control transistor M6 shown in FIG. 1G.

It should be noted that, the first power line VGL, the second power line VGH, the reset signal line RST, the first control voltage line RG1 and the second control voltage line RG2 as well as a plurality of clock signal lines may be arranged in parallel along the first direction Y, or may also intersect with each other by a certain angle (e.g., less than or equal to 20°), which will not be limited in the embodiment of the present disclosure.

For example, the display substrate 1 includes a display region 102 (e.g., the display region 102 may also be referred to as a pixel array region) and a peripheral region 106 located on at least one side of the pixel array region, for example, the first power line VGL, the second power line VGH, the reset signal line RST, the first control voltage line RG1, the second control voltage line RG2, the plurality of clock signal lines and the shift register unit 104 as described above are located on the peripheral region 106 of the base substrate 10 and are located on one side of the base substrate 10 (as shown in FIG. 1A, located between the display region 102 and a side edge of the base substrate 10), for example, as shown in FIG. 1A, located on a left side of the base substrate 10, or of course, may also be located on a right side of the base substrate 10, or located on both left side and right side of the base substrate 10, which will not be limited in the embodiments of the present disclosure.

For example, in the second direction X, the reset signal line RST, the first control voltage line RG1, the second control voltage line RG2, the trigger signal line GSTV, the fourth clock signal line CLK4, the third clock signal line CLK3, the first power line VGL are arranged side by side from left to right, and are located on a side, for example, a left side, of the respective transistors of the above-described shift register unit that is away from the display region; the second clock signal line CLK2, the first clock signal line CLK1 and the second power line VGH are arranged side by side from left to right in the second direction X, and located on a side, for example, a right side, of the respective transistors of the above-described shift register unit that is close to the display region, which, thus, may greatly simplify the traces, greatly save circuit layout space, and is favorable for implementing narrow frame design of the display substrate.

For example, an included angle between the first direction Y and the second direction X is between 70° to 90°, with 70° and 90° included. For example, the included angle between the first direction Y and the second direction X is 70°, 75°, 85°, 90°, or 80°, etc., which may be set according to actual conditions, and will not be limited in the embodiments of the present disclosure.

In the display substrate provided by at least one embodiment of the present disclosure, by changing the positions of the first clock signal line CLK1 and the second clock signal line CLK2, load of the first clock signal line CLK1 and the second clock signal line CLK2 may be reduced, thereby improving drive capability of the display substrate.

Figure 10:
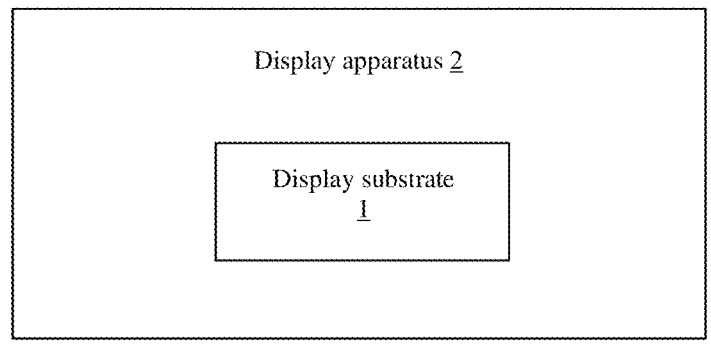
FIG. 10 is a display apparatus provided by at least one embodiment of the present disclosure.

At least one embodiment of the present disclosure further provides a display apparatus. FIG. 10 is a schematic diagram of a display apparatus provided by at least one embodiment of the present disclosure. As shown in FIG. 10, the display apparatus 2 includes the display substrate 1 provided by any one embodiment of the present disclosure, for example, the display substrate 1 shown in FIG. 2.

It should be noted that, the display apparatus 2 may be an OLED panel, an OLED television, a QLED panel, a QLED television, a mobile phone, a tablet personal computer, a laptop, a digital photo frame, a navigator, or any other product or component having a display function. The display apparatus 2 may further include other components, for example, a data driver circuit, a timing controller, etc., which will not be limited in the embodiment of the present disclosure.

It should be noted that, for clarity and conciseness, the embodiment of the present disclosure does not give all the component units of the display apparatus. In order to implement basic functions of the display apparatus, those skilled in the art may provide and arrange other structures not shown according to specific needs, which will not be limited in the embodiment of the present disclosure.

For technical effects of the display apparatus 2 provided by the above-described embodiment, the technical effects of the display substrate 1 provided by the embodiments of the present disclosure may be referred to, and no details will be repeated here.

For this disclosure, the following points need to be explained:

(1) The drawings of the embodiments of the present disclosure only relate to the structures related to the embodiments of the present disclosure, and other structures can refer to the general design.

(2) Without conflict, the embodiments of the present disclosure and the features in the embodiments can be combined with each other to obtain a new embodiment.

The above is only the specific implementation of the present disclosure, but the scope of protection of the present disclosure is not limited to this. The scope of protection of the present disclosure should be based on the scope of protection of the claims.

What is claimed is:

1. A display substrate, comprising:
a base substrate, comprising a display region and a peripheral region located on at least one side of the display region; and
a first gate drive circuit provided on the peripheral region of the base substrate,
wherein the first gate drive circuit comprises a first clock signal line, a second clock signal line and N shift register units that are cascaded;
each shift register unit of the N shift register units comprises a first control circuit, a second control circuit, a first output circuit, a second output circuit and an output terminal;
the first output circuit is electrically connected with a first node, a first clock signal terminal and the output terminal, respectively, and is configured to turn on or turn off a connection between the output terminal and the first clock signal terminal under control of a potential of the first node;
the second output circuit is electrically connected with a second node, the output terminal and a first voltage terminal, respectively, and is configured to turn on or turn off a connection between the output terminal and the first voltage terminal under control of a potential of the second node;
the first control circuit is electrically connected with a control terminal, the first node and a first control voltage terminal, respectively, and is configured to turn on or turn off a connection between the first node and the first control voltage terminal under control of a control signal supplied by the control terminal;
the second control circuit is electrically connected with the control terminal, the second node and a second control voltage terminal, respectively, and is configured to turn on or turn off a connection between the second node and the second control voltage terminal under control of the control signal;
wherein the first clock signal line and the second clock signal line extend along a first direction on the base substrate, and are configured to supply a first clock signal to the first clock signal terminal of the shift register unit, and the first clock signal line and the second clock signal line are not connected with a same shift register unit;
the first output circuit comprises a first output transistor, an orthographic projection of the first clock signal line and an orthographic projection of the second clock signal line on the base substrate are located on a side of the first output transistor close to the display region, the orthographic projection of the second clock signal line on the base substrate is located between an orthographic projection of the first output transistor on the base substrate and the orthographic projection of the first clock signal line on the base substrate; and
where N is an integer greater than 1,
wherein the first control circuit comprises a first control transistor, and the second control circuit comprises a second control transistor,
an active layer of the first control transistor and an active layer of the second control transistor are arranged side by side in the second direction,
a gate electrode of the first control transistor and a gate electrode of the second control transistor are integrally formed and extend along the second direction, and
an orthographic projection of the first output transistor on the base substrate is located between an orthographic projection of the first control transistor and the second control transistor on the base substrate and an orthographic projection of the second clock signal line on the base substrate, and an orthographic projection of the first control transistor on the base substrate is located between an orthographic projection of the second control transistor on the base substrate and the orthographic projection of the first output transistor on the base substrate.

2. The display substrate according to claim 1, further comprising a third clock signal line and a fourth clock signal line extending along the first direction,
the shift register unit further comprises a second node control circuit and a third node control circuit,
wherein the third node control circuit is electrically connected with the first clock signal terminal, the second clock signal terminal, the input terminal and a third node, respectively, and is configured to turn on or turn off a connection between the third node and the input terminal under control of a first clock signal supplied by the first clock signal terminal and a second clock signal supplied by the second clock signal terminal;
the second node control circuit is electrically connected with the second node, a second voltage terminal, a fourth node, a third clock signal terminal and a control node, respectively, and is configured to turn on or turn off a connection between the control node and the second voltage terminal under control of a potential of the fourth node, and to turn on or turn off a connection between the control node and the third clock signal terminal under control of the potential of the second node, and to control the potential of the second node according to a potential of the control node;

wherein the third clock signal line is connected with a second clock signal terminal of a (2n)th-stage shift register unit to supply the second clock signal, the fourth clock signal line is connected with a third clock signal terminal of the (2n)th-stage shift register unit to supply a third clock signal, the fourth clock signal line is connected with a second clock signal terminal of a (2n−1)th-stage shift register unit to supply the second clock signal; the third clock signal line is connected with a third clock signal terminal of the (2n−1) th-stage shift register unit to supply the third clock signal, and n is an integer greater than or equal to 1 and less than or equal to N; and an orthographic projection of the third clock signal line and an orthographic projection of the fourth clock signal line on the base substrate are located on a side of the first output transistor away from the display region.

3. The display substrate according to claim 1, further comprising a second gate drive circuit and a third gate drive circuit, wherein the display region comprises a plurality of rows of pixel units, each row of pixel units comprises a plurality of columns of pixel units;

the first gate drive circuit is configured to be connected with gate electrodes of oxide transistors in the plurality of rows of pixel units;

the second gate drive circuit is configured to be connected with gate electrodes of data writing transistors in the plurality of rows of pixel units;

the third gate drive circuit is configured to be connected with gate electrodes of light-emitting control transistors in the plurality of rows of pixel units to control light emission of light-emitting elements in the plurality of rows of pixel units; and orthographic projections of the second gate drive circuit and the third gate drive circuit on the base substrate are located on a side of an orthographic projection of the first gate drive circuit on the base substrate away from the display region.

4. The display substrate according to claim 3, further comprising an eighth connecting line and a ninth connecting line;

wherein the eighth connecting line is connected with an output terminal of one shift register unit of the second gate drive circuit and a gate line corresponding to the one shift register unit of the second gate drive circuit;

the ninth connecting line is connected with an output terminal of one shift register unit of the third gate drive circuit and a gate line corresponding to the one shift register unit of the third gate drive circuit.

5. The display substrate according to claim 1, further comprising a reset signal line, a first connecting electrode and a first connecting line;

wherein the reset signal line extends along the first direction and is configured to be connected with a control terminal of the first control circuit and a control terminal of the second control circuit to supply the control signal;

the first connecting line extends along the second direction, a first terminal of the first connecting line is connected with the reset signal line through a via hole penetrating through an insulating layer, and a second terminal of the first connecting line is connected with a first terminal of the first connecting electrode through a via hole penetrating through an insulating layer; and the first connecting electrode extends along the first direction, a second terminal of the first connecting electrode is connected with the gate electrode of the first control transistor and the gate electrode of the second control transistor through a via hole penetrating through an insulating layer.

6. The display substrate according to claim 5, further comprising a first control voltage line, wherein the first control voltage line extends along the first direction, and is configured to be connected with the first control voltage terminal to supply a first control voltage, and an orthographic projection of the first control voltage line on the base substrate is located on a side of an orthographic projection of the reset signal line on the base substrate close to the display region.

7. The display substrate according to claim 6, further comprising a second connecting electrode and a second connecting line, wherein a first terminal of the second connecting electrode is connected and integrally formed with a first electrode of the first control transistor, a second terminal of the second connecting electrode is connected with a first terminal of the second connecting line through a via hole penetrating through an insulating layer, and a second terminal of the second connecting line is connected with the first control voltage line through a via hole penetrating through an insulating layer.

8. The display substrate according to claim 6, further comprising a third connecting electrode, wherein a first terminal of the third connecting electrode is connected and integrally formed with a second electrode of the first control transistor; and a second terminal of the third connecting electrode is connected with the gate electrode of the first output transistor through a via hole penetrating through an insulating layer.

9. The display substrate according to claim 6, further comprising a second control voltage line, wherein the second control voltage line extends along the first direction, and is configured to be connected with the second control voltage terminal to supply the second control voltage; and an orthographic projection of the first control voltage line on the base substrate is located between an orthographic projection of the second control voltage line on the base substrate and the orthographic projection of the reset signal line on the base substrate.

10. The display substrate according to claim 9, further comprising a fourth connecting electrode and a third connecting line, wherein a first terminal of the fourth connecting electrode is connected and integrally formed with the first electrode of the second control transistor; a second terminal of the fourth connecting electrode is connected with a first terminal of the third connecting line through a via hole penetrating through an insulating layer; and a second terminal of the third connecting line is connected with the second control voltage line through a via hole penetrating through an insulating layer.

11. The display substrate according to claim 10, wherein the shift register unit further comprises a fourth node control circuit, a sixth node control circuit and a first node control circuit, wherein the fourth node control circuit is electrically connected with the first voltage terminal, the second clock signal terminal, the fourth node and a third node, respectively, and is configured to turn on or turn off a connection between the fourth node and the first voltage terminal under control of the second clock signal, and to turn on or turn off a connection between the fourth node and the second clock signal terminal under control of a potential of the third node;

the sixth node control circuit is electrically connected with a fifth node, the third clock signal terminal and a sixth node, respectively, and is configured to turn on or turn off a connection between the sixth node and the third clock signal terminal under control of a potential of the fifth node, and control a potential of the sixth node according to the potential of the fifth node; and the first node control circuit is electrically connected with the sixth node, the third clock signal terminal, the first node, the second node and the first clock signal terminal, respectively, and is configured to turn on or turn off a connection between the sixth node and the first node under control of a third clock signal supplied by the third clock signal terminal, turn on or turn off a connection between the first node and the first clock signal terminal under control of the potential of the second node, and control the potential of the first node according to the first clock signal;

the first node control circuit comprises a first transistor, a second transistor and a first capacitor;

an active layer of the first transistor extends along the second direction, a gate electrode of the first transistor extends along the first direction, an active layer of the second transistor extends along the second direction, an orthographic projection of the first capacitor on the base substrate is located between an orthographic projection of the active layer of the first output transistor on the base substrate and the orthographic projection of the second clock signal line on the base substrate; and in the second direction, an orthographic projection of the second transistor on the base substrate is located between the orthographic projection of the first transistor on the base substrate and an orthographic projection of the second control transistor on the base substrate.

12. The display substrate according to claim 11, further comprising a fifth connecting electrode, wherein the fifth connecting electrode comprises a first portion extending along the first direction and a second portion extending along the second direction; and a first terminal of the first portion of the fifth connecting electrode is connected with a gate electrode of the second transistor, a second terminal of the first portion of the fifth connecting electrode is connected with a first terminal of the second portion of the fifth connecting electrode, a second terminal of the second portion of the fifth connecting electrode is connected and integrally formed with the second electrode of the second control transistor; and the second terminal of the second portion of the fifth connecting electrode is also connected with the gate electrode of the second output transistor through a via hole penetrating through an insulating layer.

13. The display substrate according to claim 11, wherein the second node control circuit comprises a third transistor, a fourth transistor and a second capacitor, wherein an active layer of the third transistor extends along the second direction, an active layer of the fourth transistor extends along the second direction;

a gate electrode of the third transistor and a gate electrode of the second transistor are connected and integrally formed with a first electrode of the second capacitor;

in the second direction, an orthographic projection of the fourth transistor on the base substrate is located between the orthographic projection of the first transistor on the base substrate and an orthographic projection of the third transistor on the base substrate.

14. The display substrate according to claim 13, further comprising a ninth connecting electrode, a fourth connecting line, a third clock signal line, a seventh connecting electrode and a second power line, the shift register unit further comprises a third node control circuit, wherein a first terminal of the ninth connecting electrode is connected with a first terminal of the fourth connecting line through a via hole penetrating through an insulating layer;

a second terminal of the ninth connecting electrode is connected and integrally formed with a second electrode of the fourth transistor; and a second terminal of the fourth connecting line is connected with the second power line through a via hole penetrating through an insulating layer;

wherein the third clock signal line is connected with a second clock signal terminal of a (2n)th-stage shift register unit to supply a second clock signal, and is connected with a third clock signal terminal of a (2n−1)th-stage shift register unit to supply a third clock signal, and n is an integer greater than or equal to 1 and less than or equal to N, wherein the third node control circuit comprises a fifth transistor and a sixth transistor, an active layer of the fifth transistor extends along the second direction, a gate electrode of the fifth transistor extends along the first direction and is connected with a first terminal of the seventh connecting electrode through a via hole penetrating through an insulating layer;

an active layer of the sixth transistor extends along the first direction, a gate electrode of and the sixth transistor extends along the second direction, and a first terminal of a gate electrode of the sixth transistor is connected with the third clock signal line through a via hole penetrating through an insulating layer.

15. The display substrate according to claim 13, wherein the sixth node control circuit comprises a ninth transistor and a third capacitor, the active layer of the first transistor and an active layer of the ninth transistor are located in a continuous third semiconductor layer; and the active layer of the ninth transistor extends along the first direction, and a gate electrode of the ninth transistor extends along the second direction.

16. The display substrate according to claim 15, further comprising a fourth clock signal line, an eighteenth connecting electrode and a second transfer electrode, wherein the fourth clock signal line is connected with a third clock signal terminal of a (2n)th-stage shift register unit to supply a third clock signal and is connected with a second clock signal terminal of a (2n−1)th-stage shift register unit to supply the second clock signal;

the second transfer electrode extends along the second direction;

the eighteenth connecting electrode comprises a first portion extending along the second direction, a second portion extending along the second direction and a third portion extending along the first direction;

the first portion, the second portion and the third portion of the eighteenth connecting electrode are integrally formed;

a first terminal of the first portion of the eighteenth connecting electrode is connected with the gate electrode of the first transistor through a via hole penetrating through an insulating layer, a second terminal of the first portion of the eighteenth connecting electrode is connected and integrally formed with a first electrode of the ninth transistor, a third terminal of the first portion of the eighteenth connecting electrode is connected with a first terminal of the second portion of the eighteenth connecting electrode, a second terminal of the second portion of the eighteenth connecting electrode is connected with a first terminal of the third portion of the eighteenth connecting electrode, a second terminal of the third portion of the eighteenth connecting electrode is connected and integrally formed with a second electrode of the third transistor;

the second terminal of the second portion of the eighteenth connecting electrode and the first terminal of the third portion of the eighteenth connecting electrode are connected with a first terminal of the second transfer electrode through a via hole penetrating through an insulating layer; and a second terminal of the second transfer electrode is connected with the fourth clock signal line through a via hole penetrating through an insulating layer.

17. The display substrate according to claim 15, wherein the third node and the second node are a same node; or, the shift register unit further comprises a first on-off control circuit, the first on-off control circuit is electrically connected with the third node, the second node and the first voltage terminal, respectively, and the first on-off control circuit is configured to turn on or turn off a connection between the third node and the second node under control of a first voltage signal supplied by the first voltage terminal.

18. The display substrate according to claim 1, wherein the first clock signal line is connected with a first clock signal terminal of a (2n−1)th-stage shift register unit to supply the first clock signal; and the second clock signal line is connected with a first clock signal terminal of a (2n)th-stage shift register unit to supply the first clock signal, n is an integer greater than or equal to 1 and less than or equal to N.

19. The display substrate according to claim 1, wherein the second output circuit comprises a second output transistor, an active layer of the first output transistor and an active layer of the second output transistor are located in a continuous first semiconductor layer, the first semiconductor layer extends along the first direction;

a gate electrode of the first output transistor and a gate electrode of the second output transistor both extend along a second direction different from the first direction;

the gate electrode of the first output transistor comprises a plurality of sub-gate electrodes arranged in parallel in the first direction.

20. A display apparatus, comprising a display substrate, wherein the display substrate comprises a base substrate comprising a display region and a peripheral region located on at least one side of the display region, and a first gate drive circuit provided on the peripheral region of the base substrate, wherein the first gate drive circuit comprises a first clock signal line, a second clock signal line and N shift register units that are cascaded;

each shift register unit of the N shift register units comprises a first control circuit, a second control circuit, a first output circuit, a second output circuit and an output terminal;

the first output circuit is electrically connected with a first node, a first clock signal terminal and the output terminal, respectively, and is configured to turn on or turn off a connection between the output terminal and the first clock signal terminal under control of a potential of the first node;

the second output circuit is electrically connected with a second node, the output terminal and a first voltage terminal, respectively, and is configured to turn on or turn off a connection between the output terminal and the first voltage terminal under control of a potential of the second node;

the first control circuit is electrically connected with a control terminal, the first node and a first control voltage terminal, respectively, and is configured to turn on or turn off a connection between the first node and the first control voltage terminal under control of a control signal supplied by the control terminal;

the second control circuit is electrically connected with the control terminal, the second node and a second control voltage terminal, respectively, and is configured to turn on or turn off a connection between the second node and the second control voltage terminal under control of the control signal;

wherein the first clock signal line and the second clock signal line extend along a first direction on the base substrate, and are configured to supply a first clock signal to the first clock signal terminal of the shift register unit, and the first clock signal line and the second clock signal line are not connected with a same shift register unit;

the first output circuit comprises a first output transistor, an orthographic projection of the first clock signal line and an orthographic projection of the second clock signal line on the base substrate are located on a side of the first output transistor close to the display region, the orthographic projection of the second clock signal line on the base substrate is located between an orthographic projection of the first output transistor on the base substrate and the orthographic projection of the first clock signal line on the base substrate; and where N is an integer greater than 1, wherein the first control circuit comprises a first control transistor, and the second control circuit comprises a second control transistor, an active layer of the first control transistor and an active layer of the second control transistor are arranged side by side in the second direction, a gate electrode of the first control transistor and a gate electrode of the second control transistor are integrally formed and extend along the second direction, and an orthographic projection of the first output transistor on the base substrate is located between an orthographic projection of the first control transistor and the second control transistor on the base substrate and an orthographic projection of the second clock signal line on the base substrate, and an orthographic projection of the first control transistor on the base substrate is located between an orthographic projection of the second control transistor on the base substrate and the orthographic projection of the first output transistor on the base substrate.

* * * * *